(12) United States Patent
Nagashima et al.

(10) Patent No.: US 8,218,032 B2
(45) Date of Patent: **\*Jul. 10, 2012**

(54) IMAGING APPARATUS AND METHOD FOR PRODUCING THE SAME, PORTABLE EQUIPMENT, AND IMAGING SENSOR AND METHOD FOR PRODUCING THE SAME

(75) Inventors: Michiyoshi Nagashima, Nara (JP); Katsumi Imada, Nara (JP); Seiji Nishiwaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 5 days.

This patent is subject to a terminal disclaimer.

(21) Appl. No.: 13/032,196

(22) Filed: Feb. 22, 2011

(65) Prior Publication Data

US 2011/0141309 A1 Jun. 16, 2011

Related U.S. Application Data

(63) Continuation of application No. 10/972,890, filed on Sep. 30, 2004, now Pat. No. 7,924,327.

(30) Foreign Application Priority Data

Oct. 22, 2003 (JP) ................. 2003-362579
Jan. 5, 2004 (JP) ................. 2004-000070
Mar. 30, 2004 (JP) ................. 2004-100064

(51) Int. Cl.
*H04N 5/262* (2006.01)
*H04N 5/225* (2006.01)
*H04N 13/00* (2006.01)
*H04N 5/238* (2006.01)

(52) U.S. Cl. ........ 348/239; 348/218.1; 348/43; 348/369

(58) Field of Classification Search ............ 348/239, 348/218.1, 43, 369, 333.01, 51
See application file for complete search history.

(56) References Cited

U.S. PATENT DOCUMENTS

| | | | |
|---|---|---|---|
| 4,920,418 A | 4/1990 | Robinson | |
| 6,611,289 B1 | 8/2003 | Yu et al. | |
| 2002/0067416 A1* | 6/2002 | Yoneda et al. | 348/304 |
| 2002/0089596 A1* | 7/2002 | Suda | 348/302 |
| 2003/0048368 A1 | 3/2003 | Bosco et al. | |
| 2003/0071905 A1 | 4/2003 | Yamasaki | |
| 2003/0194143 A1 | 10/2003 | Iida | |
| 2003/0234907 A1 | 12/2003 | Kawai | |
| 2004/0004723 A1* | 1/2004 | Seko et al. | 356/498 |
| 2004/0012683 A1 | 1/2004 | Yamasaki et al. | |

(Continued)

FOREIGN PATENT DOCUMENTS

EP   0 720 125   7/1996

(Continued)

*Primary Examiner* — Jason Chan
*Assistant Examiner* — Joel Fosselman
(74) *Attorney, Agent, or Firm* — Hamre, Schumann, Mueller & Larson, P.C.

(57) ABSTRACT

A plurality of imaging regions are provided in one-to-one correspondence with a plurality of optical systems and are disposed on optical axes of the respective optical systems. Each imaging region has a plurality of pixels. The imaging apparatus further comprises an origin detecting means for detecting an origin of each imaging region, a pixel position specifying means for specifying positions of a plurality of pixels included in each imaging region using the origin as a reference, and a combination means for combining a plurality of images captured by the respective imaging regions. Thereby, it is possible to make a thin imaging apparatus capable of being easily assembled.

4 Claims, 29 Drawing Sheets

U.S. PATENT DOCUMENTS

2004/0174237 A1   9/2004   Matsumoto

FOREIGN PATENT DOCUMENTS

| | | |
|---|---|---|
| EP | 1 206 126 | 5/2002 |
| JP | 5-006988 | 1/1993 |
| JP | 2000-194026 | 7/2000 |
| JP | 2001-078213 | 3/2001 |
| JP | 2002-084412 | 3/2002 |
| JP | 2002-135795 | 5/2002 |
| JP | 2002-204462 | 7/2002 |
| JP | 2002-209226 | 7/2002 |
| JP | 2002-214662 | 7/2002 |
| JP | 2002-330332 | 11/2002 |
| JP | 2003-032537 | 1/2003 |
| JP | 2003-255225 | 9/2003 |
| JP | 2003-259194 | 9/2003 |
| JP | 2004-128201 | 4/2004 |

* cited by examiner 105, 106, 107, 108

IMAGING APPARATUS AND METHOD FOR PRODUCING THE SAME, PORTABLE EQUIPMENT, AND IMAGING SENSOR AND METHOD FOR PRODUCING THE SAME

CROSS-REFERENCE TO RELATED APPLICATION

This application is a Continuation of application Ser. No. 10/972,890, filed Sep. 30, 2004, which application is incorporated herein by reference.

BACKGROUND OF THE INVENTION

1. Field of the Invention

The present invention relates to a small imaging apparatus capable of obtaining a sharp color image and a production method thereof. The present invention also relates to a portable device comprising the imaging apparatus. The present invention also relates to an imaging sensor for use in the imaging apparatus and a production method thereof.

2. Description of the Related Art

Portable equipments, such as a mobile phone with camera and the like, have become widespread. As the portable equipment is made smaller, thinner and more multifunctional, there is a demand for a smaller, thinner and more multifunctional imaging apparatus.

Conventionally, an imaging apparatus that uses a composite lens and an imaging sensor to take a magnified picture (zoomed picture) by mechanically moving a portion of the composite lens, has been known (e.g., see JP 2003-255225A).

FIG. 33 is a cross-sectional view of a conventional imaging apparatus.

In FIG. 33, 2001 indicates a concave lens, 2002 indicates a convex lens, 2003 indicates a filter, 2004 indicates an imaging sensor, 2005 indicates a substrate including a computing apparatus, such as a digital signal processor (DSP) or the like. The concave lens 2001, the convex lens 2002, the filter 2003, the imaging sensor 2004, and the substrate 2005 are disposed in a housing 2007 in a manner such that an optical axis 2006 of the lens system passes through substantially the center of the imaging sensor 2004. Light that is incident from a object through an opening 2007a of the housing into the housing 2007 is converged on the imaging sensor 2004 by the concave lens 2001 and the convex lens 2002. The filter 2003 prevents unnecessary light, such as infrared light and the like, from entering the imaging sensor 2004. In this case, the concave lens 2001 and the convex lens 2002 are appropriately combined in a manner such that light in a red wavelength band, light in a blue wavelength band and light in a green wavelength band that are included in light from a object are converged to the same imaging position with the same image magnification factor, thereby making it possible to prevent deterioration of a captured image due to chromatic aberration. The light converged on the imaging sensor 2004 is converted to an electrical signal by the imaging sensor 2004, and the electrical signal is processed by the computing apparatus included in the substrate 2005. In general, a sharp image can be obtained by moving a part of or the whole lens system to control focusing, depending on a distance between a object and the lens system, though no actuator is shown in FIG. 33. In addition, a magnified picture (zoomed picture) can be taken by moving the convex lens 2002 to change the magnification factor of the optical system. Moving the lenses is carried out with an actuator that is electromagnetically operated and is constructed using a permanent magnet, an electromagnet, a spring material and the like.

However, the above-described conventional imaging apparatus cannot be made thin due to use of the composite lens, disadvantageously leading to an increase in the thickness of a portable equipment with camera.

SUMMARY OF THE INVENTION

The present invention is provided to solve the conventional problem. A first purpose of the present invention is to provide a thin imaging apparatus. A second purpose of the present invention is to provide an imaging apparatus that is easy to assemble. A third purpose of the present invention is to provide an imaging apparatus having multiple functions, such as focus control, operator jitters free, magnified picture and the like. A fourth purpose of the present invention is to provide an imaging sensor that can permit a thin imaging apparatus. A fifth purpose of the present invention is to provide a portable equipment having a function of operator jitters free.

A first imaging apparatus of the present invention comprises a plurality of optical systems and a plurality of imaging regions in one-to-one correspondence with the plurality of optical systems, in which each of the imaging regions has a plurality of pixels, and the imaging regions are disposed on optical axes of the respective optical systems on a one-to-one basis. The apparatus further comprises an origin detecting means for detecting an origin of each of the imaging regions, a pixel position specifying means for specifying positions of the plurality of pixels included in the imaging region using the origins as references, and a combination means for combining a plurality of images captured by the imaging regions.

A portable equipment of the present invention comprises the first imaging apparatus of the present invention and an angular velocity sensor provided close to the imaging apparatus, in which operator jitters free is performed based on a movement amount of the imaging apparatus detected using the angular velocity sensor.

Next, a method for producing the first imaging apparatus of the present invention, comprises disposing a plurality of imaging regions having a plurality of pixels on optical axes of respective optical systems on a one-to-one basis, detecting an origin of each of the imaging regions, and specifying positions of the plurality of pixels included in each of the imaging regions using the origin as a reference.

An imaging sensor of the present invention comprises a plurality of pixels, a high-refractive index optical material provided in a light incident portion of a light receiving portion of each of the plurality of pixels, and a low-refractive index optical material provided around the high-refractive index optical material.

A second imaging apparatus of the present invention comprises the imaging sensor of the present invention and at least one optical system.

A method for producing the imaging sensor of the present invention, comprises forming a first layer of a low-relative index optical material on light receiving portions of a plurality of pixels, forming a first hole at a position on the light receiving portion of the first layer, filling a high-refractive index optical material into the first hole, forming a second layer of a low-relative index optical material on the high-refractive index optical material filled in the first hole and the first layer, forming a second hole at a position facing the light receiving portion of the second layer, and filling a high-refractive index optical material into the second hole.

Next, a third imaging apparatus of the present invention comprises at least one optical system, an imaging sensor, and a drive means for changing relative positions of the at least one optical system and the imaging sensor in a direction parallel or perpendicular to an optical axis of the at least one optical system, in which the drive means comprises at least one actuator comprising an oscillator comprising an elastic material and a piezoelectric element attached to at least one side of the elastic material, and an elastic spring portion connected to the oscillator, and an edge on the oscillator side of the actuator is fixed, and an edge on the elastic spring portion side thereof supports the at least one optical system or the imaging sensor.

DESCRIPTION OF THE PREFERRED EMBODIMENTS

Figure 1:
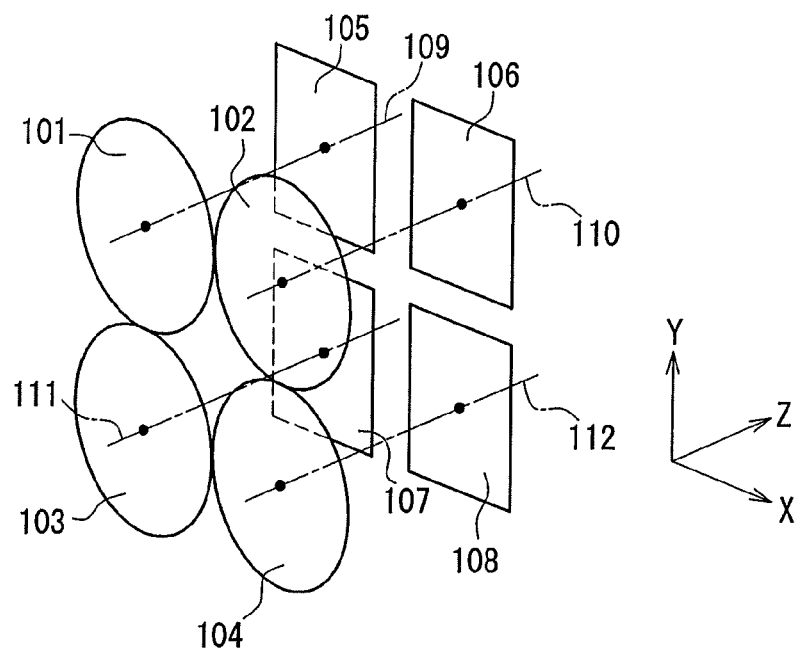
FIG. 1 is a schematic diagram of an imaging apparatus of Embodiment 1 of the present invention.

A first imaging apparatus of the present invention comprises a plurality of optical systems and a plurality of imaging regions in one-to-one correspondence with the plurality of optical systems, in which each of the imaging regions has a plurality of pixels, and the imaging regions are disposed on optical axes of the respective optical systems on a one-to-one basis. The apparatus further comprises an origin detecting means for detecting an origin of each of the imaging regions, a pixel position specifying means for specifying positions of the plurality of pixels included in the imaging region using the origins as references, and a combination means for combining a plurality of images captured by the imaging regions.

Thereby, it is possible to detect the origin of each imaging region after assembly of the imaging apparatus and specify the positions of pixels included in each imaging region. Therefore, in the assembly, it is not necessary to determine a positional relationship between the optical axis of each optical system and the origin of the corresponding imaging region with high precision, resulting in easy assembly of the imaging apparatus. In addition, since a plurality of optical systems and a plurality of imaging regions that are in one-to-one correspondence with each other are provided, the chromatic aberration of each optical system can be relaxed and the optical system can be made thin, thereby making it possible to provide a thin imaging apparatus.

In the first imaging apparatus of the present invention, it is preferable that the origin detecting means uses a plurality of images of a object captured using the plurality of optical systems and the plurality of imaging regions to detect the origin of each of the imaging regions. Thereby, it is easier to detect the origin.

In this case, it is preferable that the object is a substantially white, substantially point light source provided at a substantially infinite distance. This further improves the precision of detection of the origin.

In this case, it is preferable that the origin detecting means detects, as the origin, a position of a pixel having a largest light intensity of received light among the plurality of pixels included in the imaging region. This further improves the precision of detection of the origin.

Alternatively, it is preferable that the origin detecting means interpolates a light intensity between adjacent pixels based on light intensities of light received by the plurality of pixels included in the imaging region to detect a position having a largest light intensity as the origin. This further improves the precision of detection of the origin.

In the first imaging apparatus of the present invention, the number of the optical systems and the number of the imaging regions are each four, and the combination means combines four images captured by the four imaging regions. Thereby, image combination can be achieved efficiently.

In this case, the four imaging regions are disposed in a matrix, and two of the four imaging regions disposed on a diagonal line capture a green image, another one captures a red image, and the remaining one captures a blue image. Thereby, light from the object is divided into green, red, and blue wavelength bands before capturing it. Therefore, a requirement with respect to chromatic aberration can be relaxed for an optical system corresponding to each wavelength band, thereby making it possible to make each optical system and the imaging apparatus thinner.

In this case, it is preferable that the first imaging apparatus further comprises a green color filter disposed between each of the two imaging regions of imaging the green image and the corresponding optical system, a red color filter disposed between the imaging region of imaging the red image and the corresponding optical system, a blue color filter disposed between the imaging region of imaging the blue image and the corresponding optical system, and a light shielding plate provided on a border between each color filter. Thereby, it is possible to prevent light in one wavelength band from entering an imaging region for capturing light in other wavelength bands, resulting in a sharp color image.

It is also preferable that the first imaging apparatus further comprises a correction means for comparing the two green images, one of the two green images being used as a green reference image and the other being used as a green subsidiary image, to detect a parallax of the green subsidiary image, using the parallax of the green subsidiary image to obtain a parallax of the red image and a parallax of the blue image, and correcting the green subsidiary image, the red image and the blue image so that the parallaxes of the green subsidiary image, the red image and the blue image are reduced or eliminated, in which the combination means combines the green reference image, the corrected green subsidiary image, the corrected red image and the corrected blue image to obtain a color image. Thereby, it is possible to correct parallax caused by capturing an image using the plurality of optical systems, resulting in a sharp color image.

Alternatively, it is preferable that the first imaging apparatus further comprises a correction means for comparing the two green images, one of the two green images being used as a green reference image and the other being used as a green subsidiary image, to detect a parallax of the green subsidiary image, using the parallax of the green subsidiary image to obtain a parallax of the red image and a parallax of the blue image, and correcting the red image and the blue image so that the parallaxes of the red image and the blue image are reduced or eliminated, in which the combination means combines the green reference image, the corrected red image and the corrected blue image to obtain a color image. Thereby, it is possible to correct parallax caused by capturing an image using the plurality of optical systems, resulting in a sharp color image. In addition, it is not necessary to correct the parallax of the green subsidiary image, and no corrected green subsidiary image is required for image combination, resulting in simple image combination.

When a direction connecting the origin of the imaging region of capturing the green reference image and the origin of the imaging region of capturing the green subsidiary image is represented as a G direction, a direction connecting the origin of the imaging region of capturing the green reference image and the origin of the imaging region of capturing the red image is represented as an R direction, and a direction connecting the origin of the imaging region of capturing the green reference image and the origin of the imaging region of capturing the blue image is represented as a B direction, it is preferable that the correction means quantifies the parallax of the green subsidiary image as a vector in the G direction using the green reference image as a reference, corrects data of the red image based on the parallax quantified as the vector so that a parallax in the R direction of the red image is reduced or eliminated, and corrects data of the blue image based on the parallax quantified as the vector so that a parallax in the B direction of the blue image is reduced or eliminated. This improves the precision of correcting the parallax.

It is also preferable that the correction means selects a plurality of reference pixels from a group of pixels constituting the green reference image for serving as a reference to obtain a light intensity distribution, selects a plurality of examination pixels corresponding to the plurality of reference pixels from a group of pixels constituting the green subsidiary image to examine a parallax, detects a light intensity of each of the plurality of reference pixels to obtain a distribution of the light intensities as a first light intensity distribution, detects a light intensity of each of the plurality of examination pixels to obtain a distribution of the light intensities as a second light intensity distribution, compares the first light intensity distribution and the second light intensity distribution to recognize a common characteristic portion included in each light intensity distribution, and calculates a displacement between the characteristic portion of the first light intensity distribution and the characteristic portion of the second light intensity distribution, and quantifies a degree of the parallax of the green subsidiary image based on the displacement. This further improves the precision of correcting the parallax.

In this case, it is preferable that the correction means interpolates between the plurality of reference pixels with a virtual pixel to obtain the first light intensity distribution, and interpolates between the plurality of examination pixels with a virtual pixel to obtain the second light intensity distribution. This further improves the precision of correcting the parallax.

In the first imaging apparatus of the present invention, it is preferable that an image is captured a plurality of times at different times, a plurality of images captured by the plurality of imaging regions at each time are combined to produce a plurality of first combined images in one-to-one correspondence with the plurality of capturing operations, the plurality of first combined images are compared, and the plurality of first combined images are moved and combined in a manner such that matching portions between each first combined image overlap each other to produce a second combined image. Thereby, a jitters free image can be obtained.

In this case, it is preferable that the plurality of images captured by the plurality of imaging regions are each a green image, a red image or a blue image, and the plurality of first combined images are color images. Thereby, a jitters free sharp color image, in which the above-described parallax is corrected, can be obtained.

Alternatively, it is preferable that, in the first imaging apparatus, an image is captured a plurality of times at different times, a plurality of images captured by the same imaging region are compared, and the plurality of images are moved and combined in a manner such that matching portions between each image overlap each other to produce a plurality of first combined image in one-to-one correspondence with the plurality of imaging regions, and the plurality of first combined images are further combined to produce a second combined image. Thereby, a jitters free image can be obtained.

In this case, it is preferable that one of the plurality of times at which the plurality of capturing operations have been performed is used as a reference time common to the plurality of imaging regions, and the images captured at the times other than the reference time are moved relative to the images captured at the reference time while keeping coordinates of the images captured at the reference time and are combined to produce the plurality of first combined images. This improves the precision of correcting the parallax.

It is also preferable that each of the plurality of first combined images is a green image, a red image or a blue image, and the second combined image is a color image. Thereby, a jitters free sharp color image, in which the above-described parallax is corrected, can be obtained.

A portable equipment of the present invention comprises the first imaging apparatus of the present invention and an angular velocity sensor provided close to the imaging apparatus, in which operator jitters free is performed based on a movement amount of the imaging apparatus detected using the angular velocity sensor. Thereby, it is possible to provide a portable equipment capable of correcting operator jitters quickly.

It is preferable that the first imaging apparatus of the present invention further comprises a drive means for integrally moving the plurality of optical systems with respect to the plurality of imaging regions, or the plurality of imaging regions with respect to the plurality of optical systems, to change relative positions of the plurality of optical systems and the plurality of imaging regions in a direction parallel or perpendicular to the optical axes of the optical systems. Thereby, a focus control function and a magnified picture function can be achieved.

In this case, it is preferable that the drive means changes the relative positions of the plurality of optical systems and the plurality of imaging regions in two directions perpendicular to the optical axes of the optical systems and orthogonal to each other. Thereby, the quality of the magnified picture can be improved.

It is also preferable that the drive means changes the relative positions of the plurality of optical systems and the plurality of imaging regions in a direction substantially parallel to an array direction of the plurality of pixels included in the imaging regions. Thereby, the quality of the magnified picture can be further improved.

It is preferable that the drive means comprises at least one actuator comprising an oscillator comprising an elastic material and a piezoelectric element attached to at least one side of the elastic material, and an elastic spring portion connected to the oscillator, and an edge on the oscillator side of the actuator is fixed, and an edge on the elastic spring portion side thereof supports the plurality of optical systems or the plurality of imaging regions. Thereby, it is possible to provide a specific drive means that can change the relative positions of the plurality of optical systems and the plurality of imaging regions in directions parallel and/or perpendicular to the optical axes of the respective optical systems. As a result, a focus control function and a magnified picture function can be achieved.

In this case, it is preferable that the piezoelectric element is attached on both sides of the elastic material, and the piezoelectric elements on the both sides are driven using signals independent from each other. Thereby, it is possible to change the relative positions of the plurality of optical systems and the plurality of imaging regions independently in directions parallel and/or perpendicular to the optical axes of the respective optical systems.

It is preferable that the number of the actuators included in the drive means is two, and the two actuators are disposed facing each other across the plurality of optical systems or the plurality of imaging regions. Thereby, it is possible to change the relative positions of the plurality of optical systems and the plurality of imaging regions stably in directions parallel and/or perpendicular to the optical axes of the respective optical systems.

Alternatively, it is preferable that the number of the actuators included in the drive means is four, and the four actuators are disposed at intervals of 90 degrees on substantially the same plane around the plurality of optical systems or the plurality of imaging regions as a center. Thereby, it is possible to change the relative positions of the plurality of optical systems and the plurality of imaging regions stably in two orthogonal directions parallel and/or perpendicular to the optical axes of the respective optical systems.

It is preferable that an image is captured a plurality of times at different times while the relative positions of the plurality of optical systems and the plurality of imaging regions are changed in a direction perpendicular to the optical axes of the optical systems by a half of a center-to-center spacing between adjacent pixels, a plurality of images captured by the plurality of imaging region at each capturing operation are combined to produce a plurality of first combined images in one-to-one correspondence with the plurality of capturing operations, and the plurality of first combined images further are combined to produce a second combined image. Thereby, it is possible to take a magnified picture.

In this case, it is preferable that the plurality of images captured by the plurality of imaging regions are each a green image, a red image or a blue image, and the plurality of first combined images are color images. Thereby, it is possible to take a sharp color magnified picture in which the parallax is corrected.

Alternatively, it is preferable that an image is captured a plurality of times at different times while the relative positions of the plurality of optical systems and the plurality of imaging regions are changed in a direction perpendicular to the optical axes of the optical systems by a half of a center-to-center spacing between adjacent pixels, a plurality of images captured by the same imaging regions at the different times are combined to produce a plurality of first combined images in one-to-one correspondence with the plurality of imaging regions, and the plurality of first combined images are further combined to produced a second combined image. Thereby, it is possible to take a magnified picture.

In this case, it is preferable that the plurality of first combined images are each a green image, a red image or a blue image, and the second combined image is a color images. Thereby, it is possible to take a sharp color magnified picture in which the parallax is corrected.

In the first imaging apparatus of the present invention, it is preferable that each of the plurality of optical systems comprises a single lens. Thereby, the optical system can be made thin, so that the imaging apparatus can be made thin.

In this case, it is preferable that a diffraction grating is provided on at least one side of the single lens. Thereby, the quality of the captured image can be improved.

In the first imaging apparatus of the present invention, it is preferable that the plurality of imaging regions each comprise a separate imaging sensor. Thereby, a quick signal processing can be achieved.

Alternatively, in the first imaging apparatus of the present invention, it is preferable that at least two of the plurality of imaging regions share a common imaging sensor. Thereby, assembly of the imaging apparatus can be simple.

Next, a method for producing the first imaging apparatus of the present invention, comprises disposing a plurality of imaging regions having a plurality of pixels on optical axes of respective optical systems on a one-to-one basis, detecting an origin of each of the imaging regions, and specifying positions of the plurality of pixels included in each of the imaging regions using the origin as a reference.

Thereby, it is possible to detect the origin of each imaging region after assembly of the imaging apparatus and specify the positions of pixels included in each imaging region. Therefore, in the assembly, it is not necessary to determine a positional relationship between the optical axis of each optical system and the origin of the corresponding imaging region with high precision, resulting in easy assembly of the imaging apparatus.

In the method for the first imaging apparatus of the present invention, it is preferable that a plurality of images of a object captured using the plurality of optical systems and the plurality of imaging regions are used to detect the origin of each of the imaging regions. Thereby, it is easy to detect the origin.

In this case, it is preferable that the object is a substantially white, substantially point light source provided at a substantially infinite distance. This improves the precision of detection of the origin.

In this case, it is preferable that the origin detecting means detects, as the origin, a position of a pixel having a largest light intensity of received light among the plurality of pixels included in the imaging region. This further improves the precision of detection of the origin.

Alternatively, it is preferable that the origin detecting means interpolates a light intensity between adjacent pixels based on light intensities of light received by the plurality of pixels included in the imaging region to detect a position of a pixel having a largest light intensity as the origin. This further improves the precision of detection of the origin.

An imaging sensor of the present invention comprises a plurality of pixels, a high-refractive index optical material provided in a light incident portion of a light receiving portion of each of the plurality of pixels, and a low-refractive index optical material provided around the high-refractive index optical material.

Thereby, light that is obliquely incident with a wide angle can be efficiently received, resulting in a short focal length and a thin imaging apparatus.

In the imaging sensor of the present invention, it is preferable that the high-refractive index optical material has a refractive index of 1.8 or more, while the low-refractive index optical material has a refractive index of 1.8 or less. Thereby, light that is obliquely incident with a wide angle can be received more efficiently.

Also, in the imaging sensor of the present invention, it is preferable that a diameter of the high-refractive index optical material closer to the light receiving portion is smaller than a diameter of the high-refractive index optical material on the light incident side thereto. Thereby, light that is obliquely incident with a wide angle can be received more efficiently.

A second imaging apparatus of the present invention comprises the imaging sensor of the present invention and at least one optical system. Thereby, a thin imaging apparatus can be achieved.

A method for producing the imaging sensor of the present invention comprises forming a first layer of a low-relative index optical material on light receiving portions of a plurality of pixels, forming a first hole at a position on the light receiving portion of the first layer, filling a high-refractive index optical material into the first hole, forming a second layer of a low-relative index optical material on the high-refractive index optical material filled in the first hole and the first layer, forming a second hole at a position facing the light receiving portion of the second layer, and filling a high-refractive index optical material into the second hole.

Thereby, it is possible to produce efficiently an imaging sensor that efficiently receives light that is obliquely incident with a wide angle.

In the method for producing the imaging sensor of the present invention, it is preferable that the high-refractive index optical material has a refractive index of 1.8 or more, while the low-refractive index optical material has a refractive index of 1.8 or less. Thereby, an imaging sensor that efficiently can receive light that is obliquely incident with a wide angle is obtained.

Also in the method for producing the imaging sensor of the present invention, it is preferable that an opening diameter of the first hole is smaller than an opening diameter of the second hole. Thereby, an imaging sensor that more efficiently can receive light that is obliquely incident with a wide angle is obtained.

Next, a third imaging apparatus of the present invention comprises at least one optical system, an imaging sensor, and a drive means for changing relative positions of the at least one optical system and the imaging sensor in a direction parallel or perpendicular to an optical axis of the at least one optical system, in which the drive means comprises at least one actuator comprising an oscillator comprising an elastic material and a piezoelectric element attached to at least one side of the elastic material, and an elastic spring portion connected to the oscillator, and an edge on the oscillator side of the actuator is fixed, and an edge on the elastic spring portion side thereof supports the at least one optical system or the imaging sensor.

Thereby, it is possible to provide a specific drive means that can change the relative positions of the at least one optical system and the imaging sensor in a direction parallel or perpendicular to the optical axis of the at least one optical system. As a result, a focus control function, a magnified picture function and a close-up picture function can be achieved.

In the third imaging apparatus of the present invention, it is preferable that the piezoelectric element is attached on both sides of the elastic material, and the piezoelectric elements on the both sides are driven using signals independent from each other. Thereby, it is possible to change the relative positions of the at least one optical system and the imaging sensor independently in directions parallel and/or perpendicular to the optical axis of the at least one optical system.

It is preferable that the number of the actuators included in the drive means is two, and the two actuators are disposed facing each other across the at least one optical system or the imaging sensor. Thereby, it is possible to change the relative positions of the at least one optical system and the imaging sensor stably in directions parallel and/or perpendicular to the optical axis of the at least one optical system.

Alternatively, it is preferable that the number of the actuators included in the drive means is four, and the four actuators are disposed at intervals of 90 degrees on substantially the same plane around the at least one optical system or the imaging sensor as a center. Thereby, it is possible to change the relative positions of the at least one optical system and the imaging sensor stably in two orthogonal directions parallel and/or perpendicular to the optical axis of the at least one optical system.

Hereinafter, the present invention will be described in detail by way of preferable embodiments.

Embodiment 1

An imaging apparatus according to Embodiment 1 of the present invention will be described.

Figure 2:
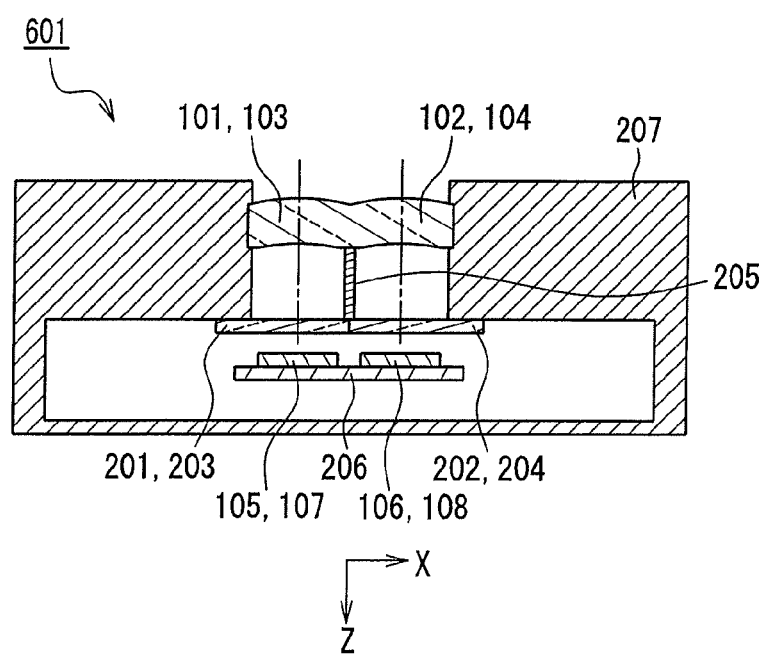
FIG. 2 is a cross-sectional view of the imaging apparatus of Embodiment 1 of the present invention.
Figure 3:
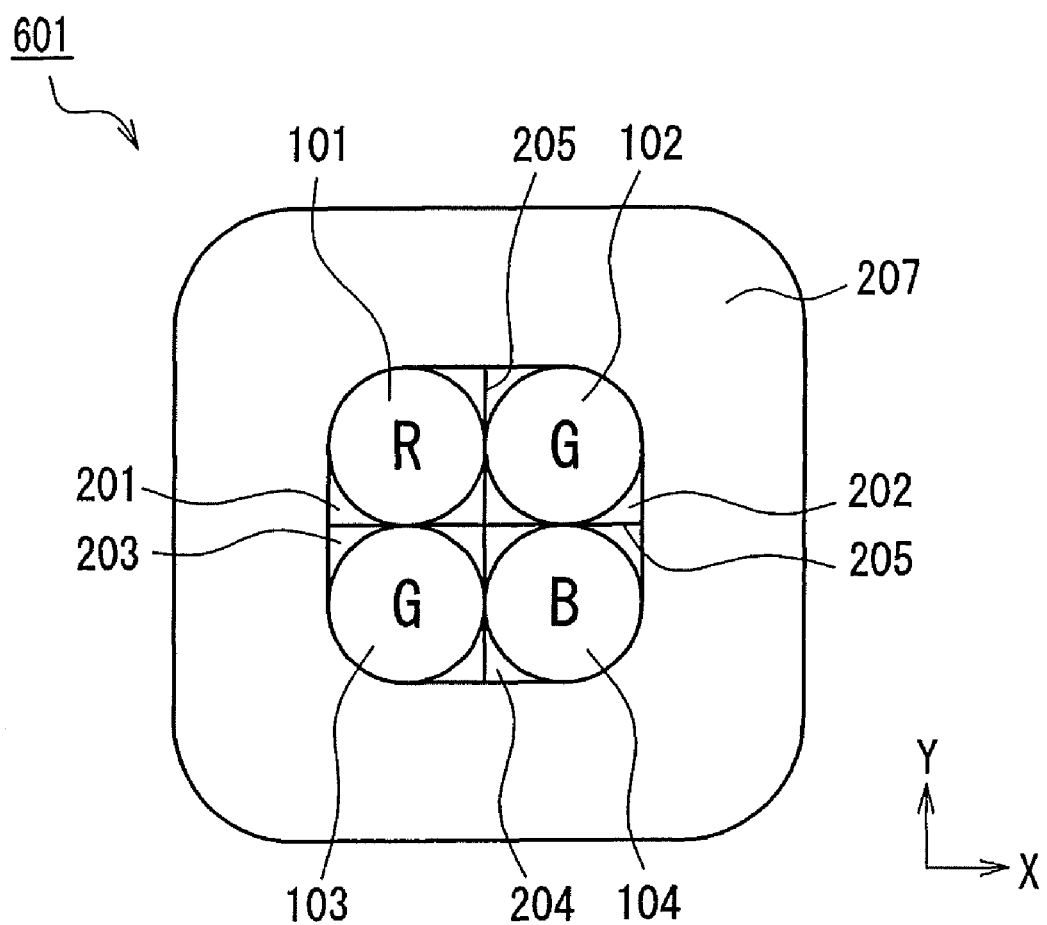
FIG. 3 is a plan view of the imaging apparatus of Embodiment 1 of the present invention, viewed from a lens side.

FIG. 1 is a schematic diagram of the imaging apparatus of Embodiment 1 of the present invention. FIG. 2 is a cross-sectional view of the imaging apparatus of Embodiment 1 of the present invention. FIG. 3 is a plan view of the imaging apparatus of Embodiment 1 of the present invention, viewed from a lens side.

In FIG. 1, the imaging apparatus of Embodiment 1 has four single lenses 101, 102, 103 and 104, and four imaging sensors 105, 106, 107 and 108 that are in one-to-one correspondence therewith. As shown in FIG. 1, a direction of optical axes 109, 110, 111 and 112 of the single lenses 101, 102, 103 and 104 is represented by a Z-axis, a direction perpendicular to the Z-axis is represented by an X-axis, and a direction perpendicular to the X-axis and the Z-axis is represented by a Y-axis. The positive direction of each of the X-axis, the Y-axis and the Z-axis is represented by an arrow in FIG. 1. The four single lenses 101, 102, 103 and 104 are disposed in a matrix on substantially the same plane (a plane parallel to the XY-plane). Also, the four imaging sensors 105, 106, 107 and 108 are disposed in a matrix on substantially the same plane (a plane parallel to the XY-plane). The four single lenses 101, 102, 103 and 104 and the four imaging sensors 105, 106, 107 and 108 are disposed in a manner such that the optical axes 109, 110, 111 and 112 of the respective single lenses 101, 102, 103 and 104 pass through substantially the centers of the respective imaging sensors 105, 106, 107 and 108.

In FIG. 2, the four single lenses 101, 102, 103 and 104 are each an aspherical lens that has an aspheric surface on at least one side thereof, and are integrated together. For example, the four single lenses 101, 102, 103 and 104 may be formed integrally of glass or plastic. A color filter is provided between each single lens and the corresponding imaging sensor. 201 indicates a color filter provided between the single lens 101 and the imaging sensor 105, 202 indicates a color filter provided between the single lens 102 and the imaging sensor 106, 203 indicates a color filter provided between the single lens 103 and the imaging sensor 107, and 204 indicates a color filter provided between the single lens 104 and the imaging sensor 108. Each color filter permits light in a red wavelength band, a green wavelength band or a blue wavelength band to pass through it. 205 indicates a light shielding plate that permits each imaging sensor to receive only light in one wavelength band, and prevents light in the wavelength band reflected from a color filter from entering other color filters. 206 indicates a substrate including a computing apparatus, such as a digital signal processor (DSP) and the like, on which the four imaging sensors 105, 106, 107 and 108 are provided. 207 indicates a housing for the imaging apparatus, which holds the four single lenses 101, 102, 103 and 104, the four color filters 201, 102, 203, 204, the four imaging sensors 105, 106, 107 and 108, and the substrate 206 in a manner such that the optical axes of the four single lenses pass through the respective corresponding imaging sensors.

In FIG. 2, the imaging sensors 105, 106, 107 and 108 and the substrate 206 appear to float in the air, however, they are actually supported via an actuator (described elsewhere below) by the housing 207. Relative positions of the four single lenses 101, 102, 103 and 104 and the four imaging sensors 105, 106, 107 and 108 can be changed using the actuator in a direction perpendicular to and/or a direction parallel to the optical axes of the single lenses.

In FIG. 3, 101, 102, 103 and 104 indicate the single lenses, 201, 202, 203 and 204 indicate the color filters, 205 indicates the light shielding plate, and 207 indicates the housing. "R", "G" and "B" indicate wavelength bands of light that are permitted to pass by the color filters 201, 202, 203 and 204 provided corresponding to the respective single lenses 101, 102, 103 and 104. That is, "R", "G" and "B" indicate a red wavelength band, a green wavelength band and a blue wavelength band, respectively. Therefore, the imaging apparatus of Embodiment 1 of FIG. 3 has one red wavelength band transmitting filter 201, two green wavelength band transmitting filters 202 and 203, and one blue wavelength band transmitting filter 204, where the two green wavelength band transmitting filters 202 and 203 are disposed on a diagonal line.

In Embodiment 1 of the present invention of FIGS. 1, 2 and 3, light in the red wavelength band that is incident from a object to the single lens 101 is transmitted through the color filter 201 to enter the imaging sensor 105. Light in the green wavelength band that is incident from a object to the single lenses 102 and 103 is transmitted through the color filters 202 and 203 to enter the imaging sensors 106 and 107, respectively. Light in the blue wavelength band that is incident from a object to the single lens 104 is transmitted through the color filter 204 to enter the imaging sensor 108. Thus, light from a object is separated into light in the red wavelength band, light in the green wavelength band, and light in the blue wavelength band, that are in turn captured by the imaging sensors 105, 106, 107 and 108. As a result, a requirement with respect to chromatic aberration can be relaxed, whereby even single lenses are used to obtain an image having a small chromatic aberration in each of the red, blue and green wavelength bands. A thin optical system can be obtained for light in each wavelength band without using a composite lens composed of a plurality of lenses, thereby making it possible to achieve a thin imaging apparatus. In Embodiment 1 of the present invention, one aspherical lens is used.

[Origin Detection and Pixel Position Specification]

In Embodiment 1 of the present invention, four images captured by the four imaging sensors 105, 106, 107 and 108 are combined to obtain a color image. The image combination is performed by the substrate 206 including a computing apparatus, such as a DSP and the like. Each imaging sensor is composed of a number of pixels. In order to combine images obtained by a plurality of imaging sensors, it is necessary to specify a coordinate for a position of each pixel included in each imaging sensor. The coordinate specification for each pixel requires an origin as a reference.

Next, the coordinate specification of an origin of each imaging sensor and the determination of coordinates of a plurality of pixels will be described for the imaging apparatus of Embodiment 1.

Figure 4:
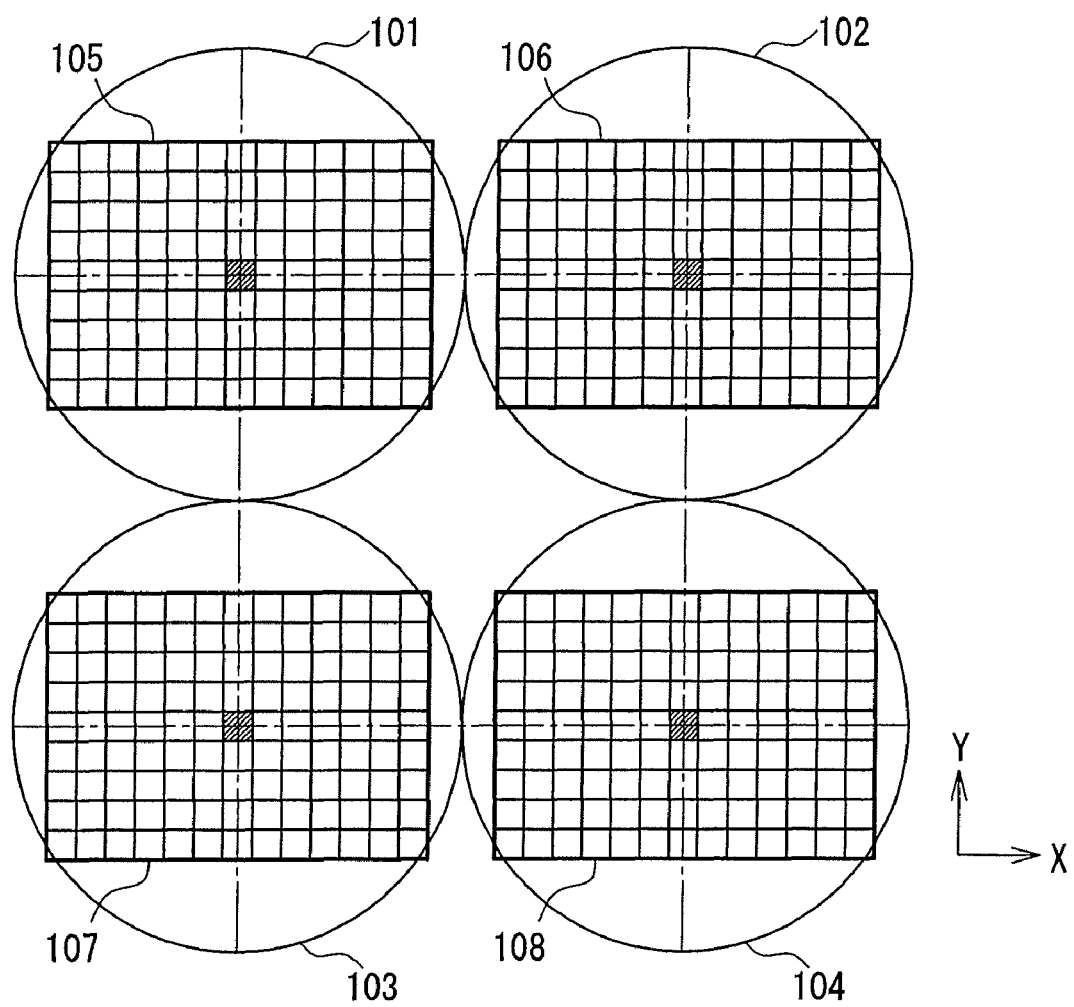
FIG. 4 is a diagram showing a highly accurate positional relationship between four single lenses and four imaging sensors in the imaging apparatus of Embodiment 1 of the present invention.
Figure 5:
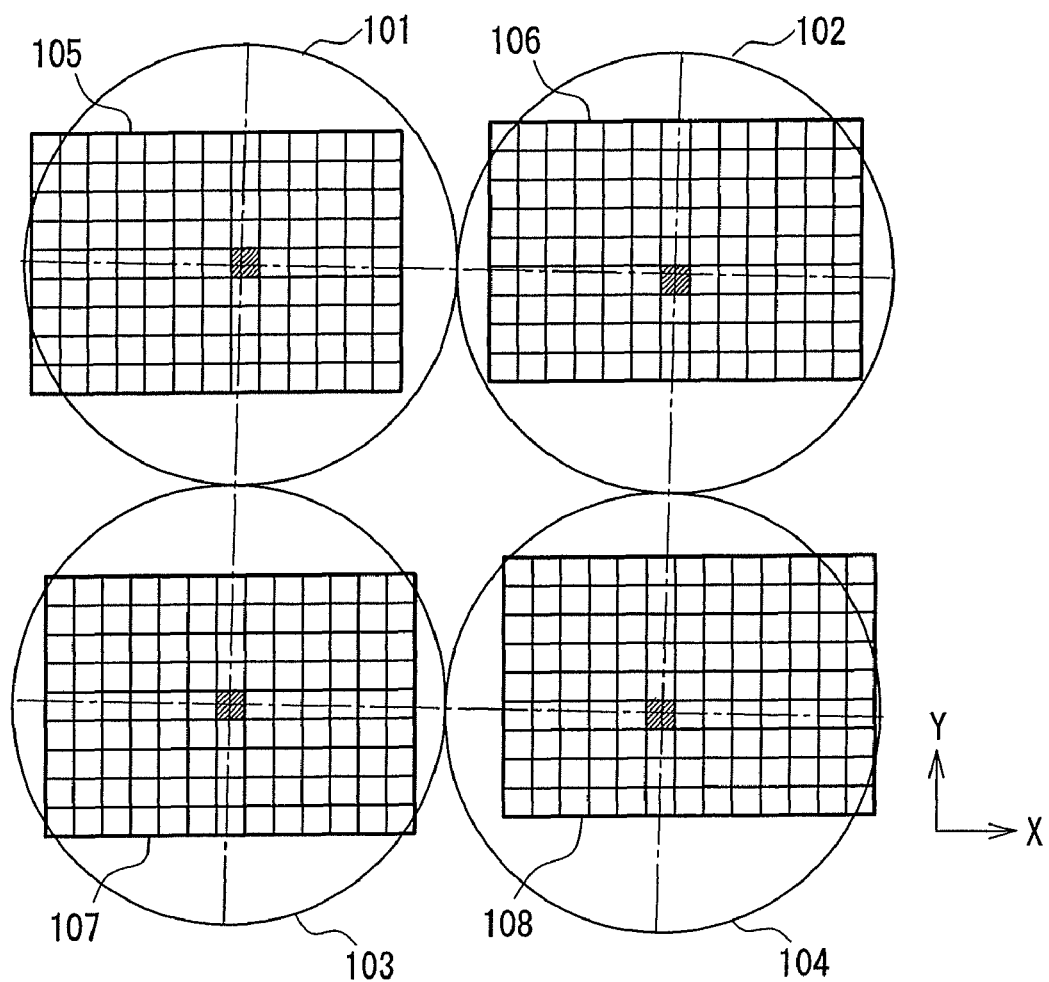
FIG. 5 is a diagram showing a general positional relationship between four single lenses and four imaging sensors in the imaging apparatus of Embodiment 1 of the present invention.

FIG. 4 is a diagram showing a highly accurate positional relationship between the four single lenses and the four imaging sensors in the imaging apparatus of Embodiment 1 of the present invention. FIG. 5 is a diagram showing a general positional relationship between the four single lenses and the four imaging sensors in the imaging apparatus of Embodiment 1 of the present invention. In FIGS. 4 and 5, the same parts as those in FIGS. 1 to 3 are indicated with the same reference numerals and will not be explained.

In FIG. 4, 105, 106, 107 and 108 indicate imaging sensors, and individual squares separated by grid lines in each imaging sensor each indicate a pixel. In FIG. 4, for the sake of simplicity, only 9 rows×13 columns of pixels are shown, though the imaging sensor is actually composed of more pixels. A pixel that is located at an intersection of the optical axis of each of the single lenses 101, 102, 103 and 104 and the corresponding one of the imaging sensors 105, 106, 107 and 108, is hatched. In the arrangement of FIG. 4, the optical axes of the single lenses 101, 102, 103 and 104 pass through the centers of the respective corresponding imaging sensors 105, 106, 107 and 108. In this case, the pixel that is located at the center of each imaging sensor can be used as an origin. The pixels of each imaging sensor are assigned coordinates using the origin as a reference. For example, in the imaging sensor 105, a center pixel through which the optical axis of the single lens 101 passes is assigned coordinates (0, 0). The pixels of the imaging sensor 105 have coordinates ranging from (−6) to (+6) in the X direction and coordinates ranging from (−4) to (+4) in the Y direction. Thus, the position of each of a total of 117 pixels can be specified. Similarly, in the imaging sensors 106, 107 and 108, a central pixel through which the optical axis of the respective single lenses 102, 103 and 104 is assigned coordinates (0, 0) and the pixels can be assigned respective coordinates.

An arrangement, such as that shown in FIG. 4, in which the optical axes of the four single lenses pass through the centers of the respective corresponding four imaging sensors, requires a considerably high-precision assembly. Conventionally, a technology of using four lenses and four imaging sensors to combine four images into one color image has been proposed. For example, JP 2001-078213A, JP 2002-204462A and JP 2002-209226A describe an imaging apparatus based on the assumption that a highly accurate positional relationship of a lens optical axis and a center of an imaging sensor.

However, each pixel has a side of about 2 to 3 μm, and therefore, it is difficult to achieve a consistent high-precision arrangement as shown in FIG. 4. In general, when four single lenses, four imaging sensors and other parts (e.g., color filters, etc.) are assembled together, the optical axes of the four single lenses do not necessarily pass through the center pixels of the respective four imaging sensors.

In FIG. 5, the arrangement of the four imaging sensors 105, 106, 107 and 108 is shifted relative to that of FIG. 4, and the arrangement of the four single lenses 101, 102, 103 and 104 is slightly rotated relative to that of FIG. 4. In the case of general assembly precision, the optical axis of each lens system does not necessarily pass through the center of the corresponding imaging sensor. Embodiment 1 of the present invention will be described with reference to the state of FIG. 5 as an example. In each of the imaging sensors 105, 106, 107 and 108, individual squares separated by grid lines each indicate a pixel. In FIG. 5, for the sake of simplicity, only 9 rows×13 columns of pixels are shown, though the imaging sensor is actually composed of more pixels. A pixel that is located at an intersection of the optical axis of each of the single lenses 101, 102, 103 and 104 and the corresponding one of the imaging sensors 105, 106, 107 and 108, is hatched. The pixel on the optical axis can be used as an origin of each imaging sensor. The pixels of each imaging sensor are assigned coordinates using the origin as a reference. For example, in the imaging sensor 105, a pixel through which the optical axis of the single lens 101 passes is assigned coordinates (0, 0). The pixels of the imaging sensor 105 have coordinates ranging from (−7) to (+5) in the X direction and coordinates ranging from (−4) to (+4) in the Y direction. In the imaging sensor 106, a pixel through which the optical axis of the single lens 102 passes is assigned coordinates (0, 0). The pixels of the imaging sensor 106 have coordinates ranging from (−6) to (+6) in the X direction and coordinates ranging from (−3) to (+5) in the Y direction. Similarly, the pixels of the imaging sensor 107 have coordinates ranging from (−6) to (+6) in the X direction and coordinates ranging from (−4) to (+4) in the Y direction using the coordinates (0, 0) as a reference. The pixels of the imaging sensor 108 have coordinates ranging from (−5) to (+7) in the X direction and coordinates ranging from (−3) to (+5) in the Y direction using the coordinates (0, 0) as a reference.

When the imaging apparatus of Embodiment 1 is assembled, a positional relationship between the optical axis of the single lens and the imaging sensor is not particularly specified. After the four single lenses, the four imaging sensors, and other parts (e.g., color filters, etc.) are fixed to the housing, the origin of each imaging sensor (a pixel on the optical axis of each lens) is detected, the coordinates of the pixel on the origin are specified as (0, 0), and the coordinates of the other many pixels are specified. The origin of each imaging sensor can be detected by taking an image of a certain object after assembly and using the image captured by the imaging sensor. For example, a method is considered in which an image of a distant object is taken and a pixel corresponding to a characteristic point image in the captured image is specified as an origin.

Next, a method of detecting an origin for the imaging apparatus of Embodiment 1 will be described.

Figure 6A:
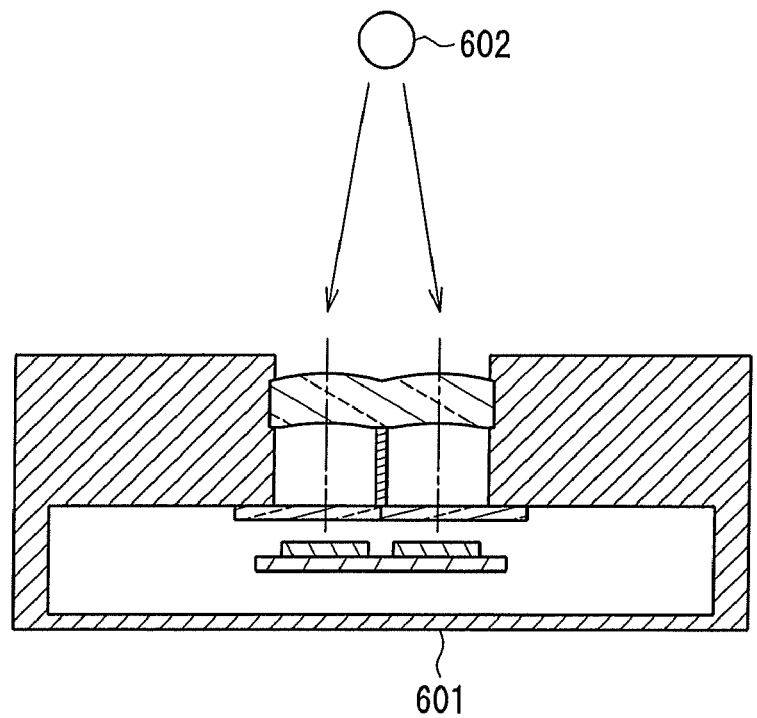
FIG. 6A is a diagram showing a method of detecting an origin of each imaging sensor in the imaging apparatus of Embodiment 1 of the present invention.
Figure 6B:
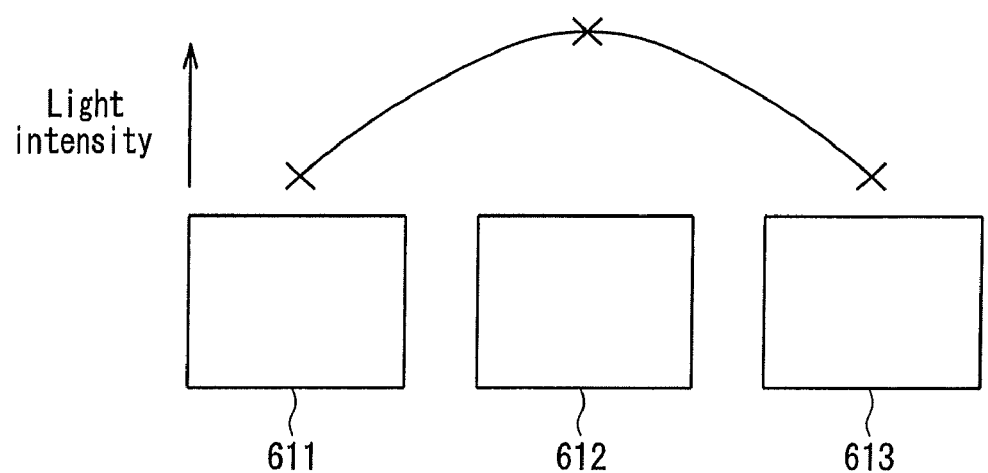
FIG. 6B is a diagram showing a light intensity distribution in the vicinity of the origin of each imaging sensor in the imaging apparatus of Embodiment 1 of the present invention.

FIG. 6A is a diagram showing a method of detecting an origin of each imaging sensor in the imaging apparatus of Embodiment 1 of the present invention. FIG. 6B is a diagram showing a light intensity distribution in the vicinity of the origin of each imaging sensor in the imaging apparatus of Embodiment 1 of the present invention.

In FIG. 6A, 601 indicates an imaging apparatus after assembly and 602 indicates a substantially point light source having a substantially white color. An image of the substantially white light source (e.g., a miniature bulb) 602 placed at a substantially infinite distance (e.g., at a distance of 10 m) is taken by each imaging sensor. Since the substantially white light source emits green, red and blue light, all the four imaging sensors take an image of the light source.

Not only one pixel takes an image of even a substantially point light source at a substantially infinite distance. For example, light from the substantially white light source at a substantially infinite distance has a light intensity distribution at a light receiving surface of each imaging sensor as shown in FIG. 6B. In this case, among pixels 611, 612 and 613 that receive light from the light source, the pixel 612 that receives the largest light intensity is specified as the origin of the imaging sensor. In this manner, the origin of each imaging sensor can be detected. For example, these origins are the hatched pixels of FIG. 5, i.e., the pixels located at the intersections of the optical axes of the single lenses and the respective corresponding imaging sensors.

Pixels are preferably interpolated with virtual pixels. In the interpolation, a spacing between pixels is divided into, for example, two, three or four (or more). A virtual pixel(s) is inserted into the spacing between pixels. A light intensity of the virtual pixel is estimated based on the light intensity of actual pixels that surround the virtual pixel. As a result, the light intensity distribution of light from a substantially white light source at a substantially infinite distance can be detected more accurately, thereby making it possible to detect the position of an origin more accurately.

Thus, by detecting the origin of an imaging sensor after assembly, a considerably high-precision assembly is not required, thereby making it easy to produce an imaging apparatus.

Hereinafter, a method for producing the imaging apparatus of Embodiment 1 will be described step by step.

(1) The four single lenses 101, 102, 103 and 104 integrated together, the four imaging sensors 105, 106, 107 and 108, the substrate 206 including the computing apparatus and the like, the parts such as the color filters 201, 202, 203 and 204 and the like, and the housing 207 are prepared.

(2) The four single lenses integrated together, the four imaging sensors, the substrate 206 including the computing apparatus and the like, and the parts such as the color filters and the like, are attached into the housing. In this case, the four imaging sensors are disposed in a matrix on the same plane, and the four single lenses integrated together are disposed as parallel to the plane as possible. However, a high level of assembly precision is not required with respect to the position of each imaging sensor relative to the optical axis of the corresponding single lens.

(3) The imaging apparatus thus assembled is used to take an image of a substantially white light source located at a distance. In each imaging sensor, a pixel that has a largest light intensity of received light (or a position having a largest light intensity of received light after a light intensity is interpolated between pixels) is detected as an origin of the imaging sensor. As the white light source, a light source that can be regarded as a point light source, such as a miniature bulb or the like, is used.

(4) The origin of each imaging sensor is used as a reference to specify the coordinates of the positions of the other many pixels in each imaging sensor.

[Parallax and Detection Thereof]

Next, an image position on each imaging sensor in the imaging apparatus of Embodiment 1 will be described.

Figure 7:
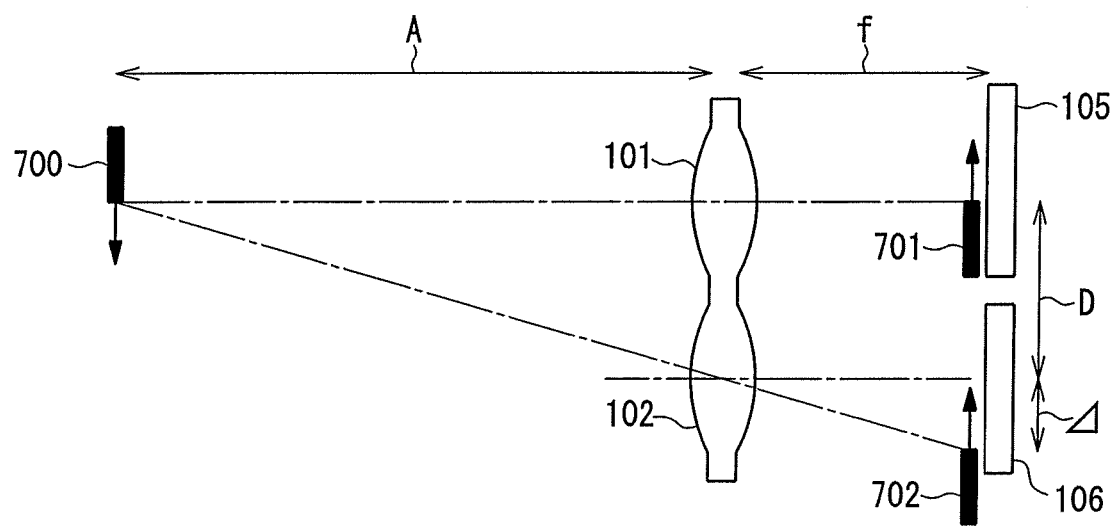
FIG. 7 is a diagram showing an imaging position in the imaging apparatus of Embodiment 1 of the present invention.
Figure 8:
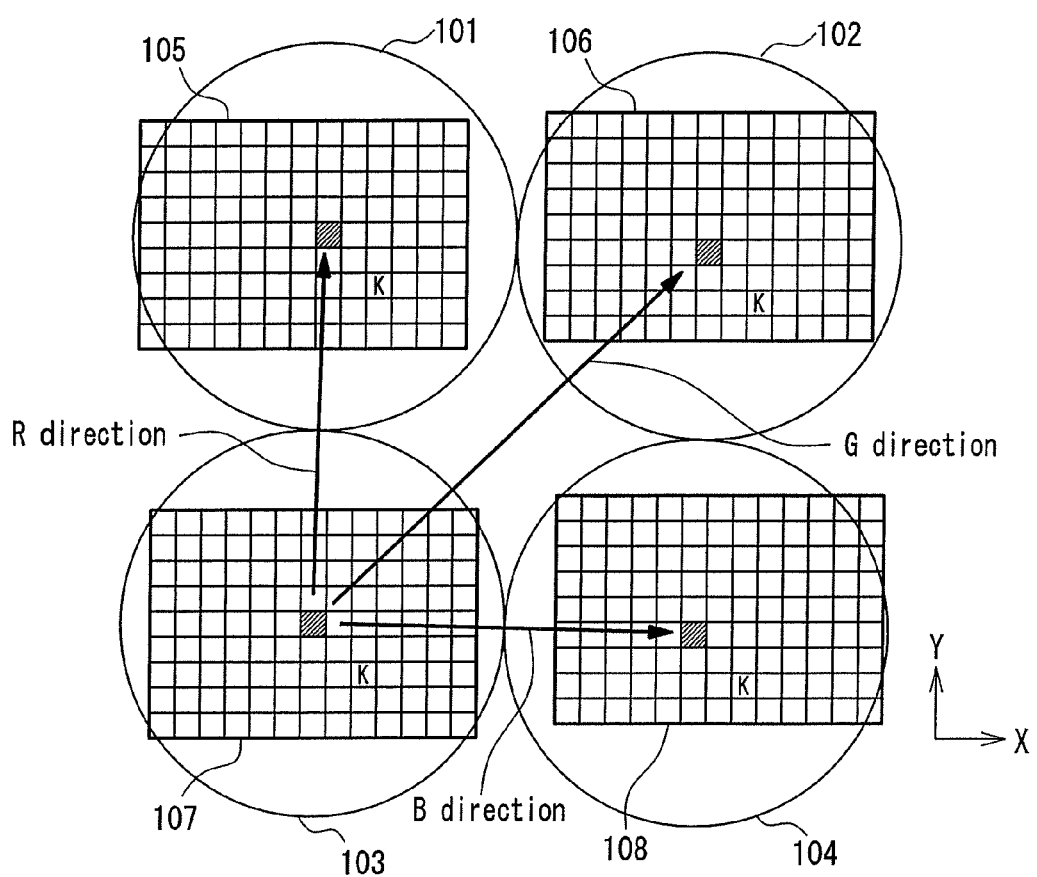
FIG. 8 is a diagram showing a direction of parallax in the imaging apparatus of Embodiment 1 of the present invention.

FIG. 7 is a diagram showing an imaging position in the imaging apparatus of Embodiment 1 of the present invention. FIG. 8 is a diagram showing a direction of parallax in the imaging apparatus of Embodiment 1 of the present invention. In FIGS. 7 and 8, the same components as those of FIGS. 1 to 6 are indicated with the same reference numerals and will not be explained.

In FIG. 7, the imaging apparatus of Embodiment 1 is used to take an image of a object 700. The image of the object 700 is formed as an optical image 701 on the imaging sensor 105 via the single lens 101. At the same time, the image of the object 700 is formed as an optical image 702 on the imaging sensor 106 via the single lens 102 adjacent to the single lens 101. In this case, the same object 700 is observed from different positions using the single lens 101 and the single lens 102, so that parallax occurs between the optical image 701 and the optical image 702. For example, even if the optical image 701 is formed on the optical axis of the single lens 101, the optical image 702 is formed at a position shifted by a parallax $\Delta$ with respect to the optical axis of the single lens 102. The parallax $\Delta$ is given by $\Delta=D\cdot f/(A-f)\approx D\cdot f/A$, where D represents an interval between the optical axis of the single lens 101 and the optical axis of the single lens 102, f represents a focal length of the single lenses 101 and 102, and A represents a distance between the object 700 and the single lenses 101 and 102.

In FIG. 8, the origin of each of the imaging sensors 105, 106, 107 and 108 is represented by a hatched pixel. The arrangement of FIG. 8 is the same as that of FIG. 5. It will be understood from the explanation of FIG. 7 that a direction that causes parallax is parallel to a direction connecting the positions (origins) of the intersections of the optical axes of the lenses and the respective corresponding imaging sensors. A direction connecting the origins of the imaging sensors 107 and 106 that take two green images is defined as a G direction. A direction connecting the origin of the imaging sensor 107 for taking a green image and the origin of the imaging sensor 108 for taking a blue image is defined as a B direction. A direction connecting the origin of the imaging sensor 107 for taking a green image and the origin of the imaging sensor 105 for taking a red image is defined as an R direction. Parallax of the images of the imaging sensors occurs parallel to the G, B and R directions.

When the object 700 is located at an infinite distance from the single lenses 101, 102, 103 and 104 ($A=\infty$), substantially no parallax occurs ($\Delta=0$). In this case, in FIG. 8, an image of a particular point of the object is formed at a pixel having the same coordinates in each imaging sensor. For example, this pixel is referred to as "K".

As the object 700 approaches the single lenses 101, 102, 103 and 104 (i.e., A decreases), the parallax $\Delta$ increases, so that the images of the object on the imaging sensors move away from each other. Specifically, in FIG. 8, when the image of the object on the imaging sensor 107 (green) is used as a reference, the images of the object on the other imaging sensors 105 (red), 106 (green) and 108 (blue) are moved parallel to the R direction, the G direction and the B direction, respectively. When, in spite of this parallax, the four images of the object captured by the four imaging sensors are combined in a manner such that the pixels having the same coordinates are superposed on one another, the resultant image is deteriorated. In order to obtain a sharp color image, it is necessary to correct the image, before the four images of the object are combined, so that parallax included in these images is reduced or eliminated.

In the imaging apparatus of Embodiment 1, as in FIG. 3, the color filters 202 and 203 for transmitting light in the green wavelength band are disposed in diagonally opposite quadrants. Of the two green wavelength band images captured by the two imaging sensors 106 and 107 corresponding to the two color filters 202 and 203, the image captured by the imaging sensor 107 is referred to as a green reference image, while the image captured by the imaging sensor 106 is referred to as a green subsidiary image. These two green wavelength band images are the same image, except for parallax. Therefore, by comparing the two green images, a parallax of the green subsidiary image can be derived. When a displacement amount of the green subsidiary image is represented by a parallax vector in the G direction, an R-direction component of the parallax vector indicates the displacement of the red image and a B-direction component of the parallax vector indicates the displacement of the blue image.

After these parallaxes are corrected, the green wavelength band reference image, the green wavelength band subsidiary image whose parallax has been corrected, the red wavelength band subsidiary image whose parallax has been corrected, and the blue wavelength band subsidiary image whose parallax has been corrected, are combined to obtain a color image.

A spacing between the centers of adjacent pixels is 2 to 3 μm. When the lenses, the imaging sensors, and the other parts are assembled using a general assembly technique, the assembly error does not reach several times the center-to-center spacing of the pixels. Therefore, the R direction is substantially the same as the Y direction of FIG. 1, and the B direction is substantially the same as the X direction of FIG. 1. Also, the G direction is substantially the same as a direction connecting the center of the imaging sensor 107 for taking the green reference image and the center of the imaging sensor 106 for taking the green subsidiary image.

Next, parallax detection of the imaging apparatus of Embodiment 1 will be described.

Figure 9:
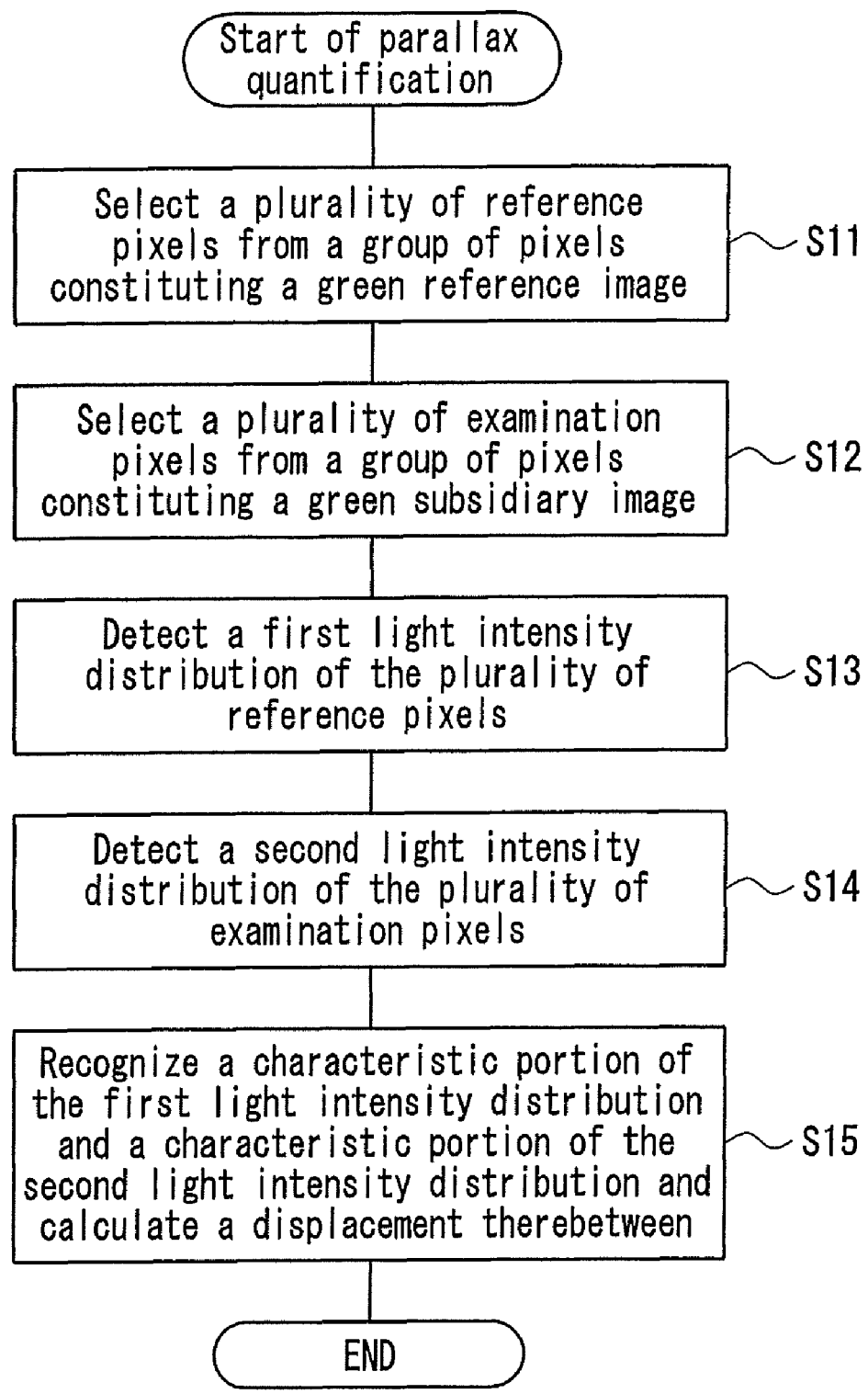
FIG. 9 is a flowchart showing a parallax quantifying program for the imaging apparatus of Embodiment 1 of the present invention.
Figure 10:
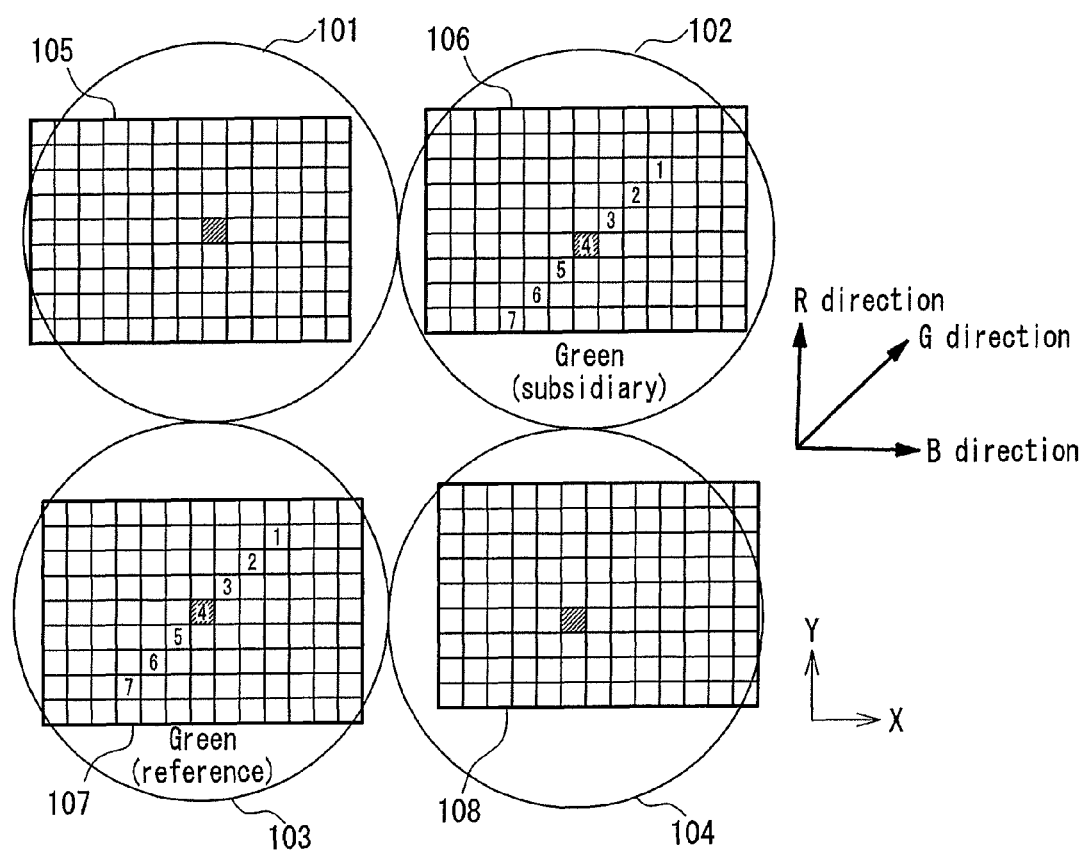
FIG. 10 is a diagram showing a group of pixels that are used in a parallax quantifying process of the imaging apparatus of Embodiment 1 of the present invention.
Figure 11:
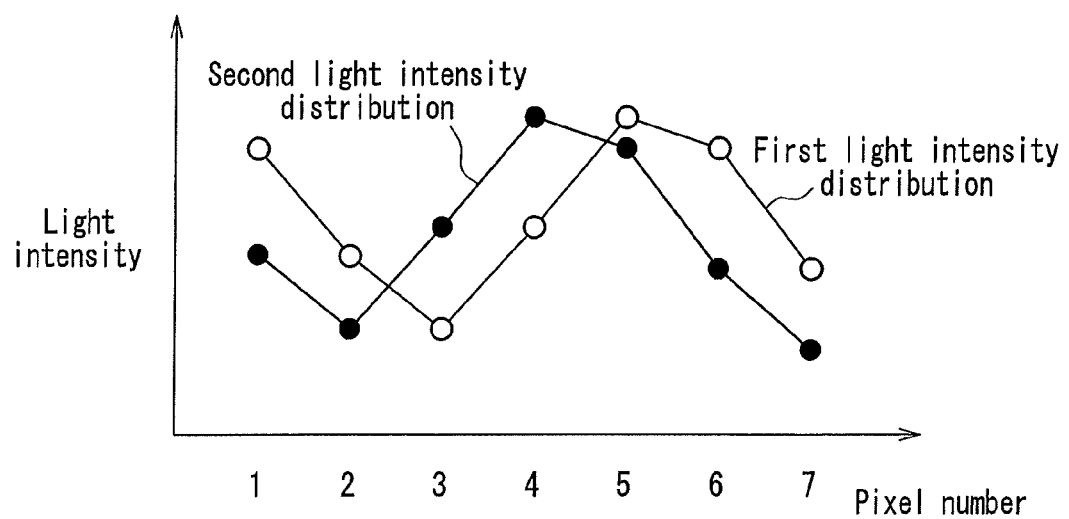
FIG. 11 is a diagram showing a light intensity distribution that is used in a parallax quantifying process of the imaging apparatus of Embodiment 1 of the present invention.
Figure 12:
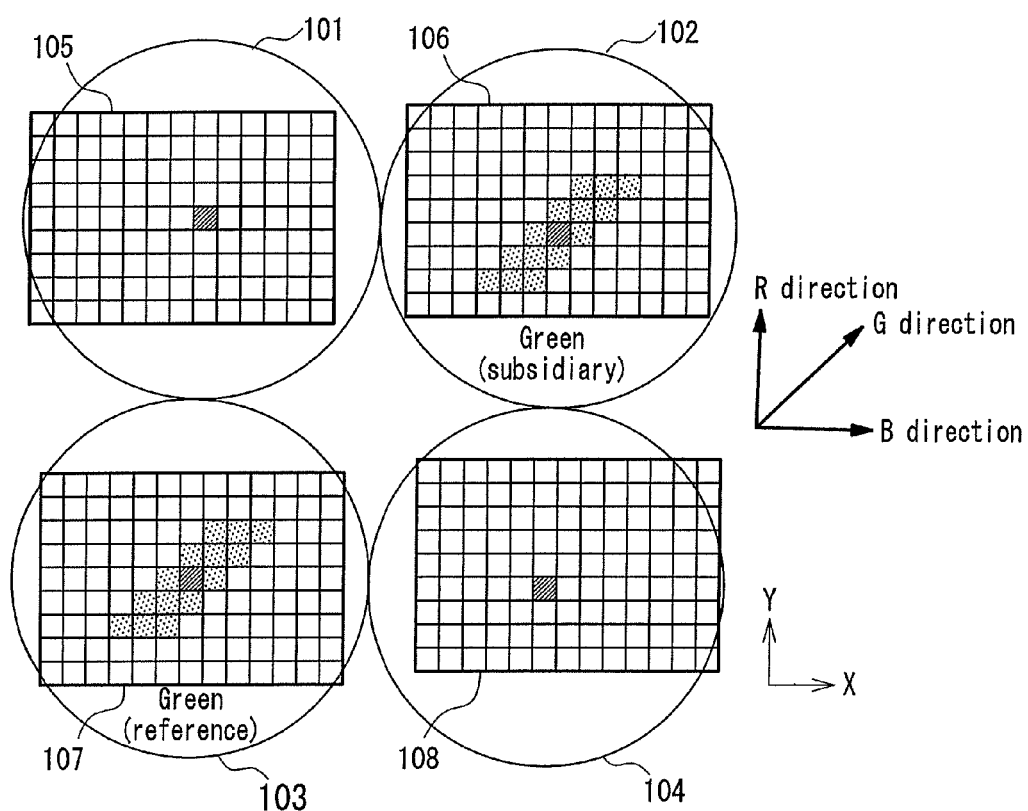
FIG. 12 is a diagram showing another example of a pixel group that is used in the parallax quantifying process of the imaging apparatus of Embodiment 1 of the present invention.

FIG. 9 is a flowchart showing a parallax quantifying program for the imaging apparatus of Embodiment 1 of the present invention. FIG. 10 is a diagram showing a group of pixels that are used in a parallax quantifying process of the imaging apparatus of Embodiment 1 of the present invention. FIG. 11 is a diagram showing a light intensity distribution that is used in a parallax quantifying process of the imaging apparatus of Embodiment 1 of the present invention. FIG. 12 is a diagram showing another example of a pixel group that is used in a parallax quantifying process of the imaging apparatus of Embodiment 1 of the present invention.

As shown in FIG. 9, when the parallax quantifying program is started, a plurality of reference pixels that provide a reference for obtaining a light intensity distribution are selected from a group of pixels constituting a green reference image in step S11.

In step S12, a plurality of examination pixels for examining parallax that correspond to the above-described reference pixels are selected from a group of pixels constituting a green subsidiary image. Due to parallax, the green subsidiary image is displaced in the G direction with respect to the green reference image. Therefore, it is appropriate to select a group of pixels arranged parallel to the G direction from the reference pixels and the examination pixels in the green reference image and the green subsidiary image, respectively, as shown in FIG. 10. In FIG. 10, seven pixels that are arranged in an oblique line around the origin (hatched pixel) as a center and are assigned codes "1" to "7", are selected.

Next, in step S13, a light intensity of each of the plurality of reference pixels is detected, and a distribution of the light intensities is obtained as a first light intensity distribution.

In step S14, a light intensity of each of the plurality of examination pixels is detected, and a distribution of the light intensities is obtained as a second light intensity distribution.

In step S15, a characteristic portion of the light intensity distribution is recognized with reference to FIG. 11, and a displacement between the characteristic portion of the first light intensity distribution and the characteristic portion of the second light intensity distribution is calculated. The displacement represents a degree of parallax. Thus, the parallax of the green subsidiary image with respect to the green reference image as a reference is quantified as a G-direction parallax vector.

In the example of FIG. 11, the characteristic portion of the first light intensity distribution and the characteristic portion of the second light intensity distribution are shifted by one pixel from each other. In other words, a parallax of the green subsidiary image with respect to the green reference image is represented by a G-direction vector having a size of one pixel in the G direction. Therefore, a parallax of the blue image with respect to the green reference image is represented by a B-direction vector having a size of one pixel in the B direction, and a parallax of the red image with respect to the green reference image is represented by an R-direction vector having a size of one pixel in the R direction.

It is desirable to select pixels that are arranged orderly and parallel to the G direction connecting the origin of the green reference image and the origin of the green subsidiary image, as the reference pixels of the green reference image and the examination pixels of the green subsidiary image. However, in general, a group of pixels that are arranged orderly and parallel to the G direction cannot be necessarily selected. Also in FIG. 10, the arrangement direction of the seven pixels "1" to "7" is slightly shifted from the G direction. It is desirable to select a plurality of pixels that are arranged two-dimensionally in a region parallel to the G direction as indicated by gray pixels in FIG. 12, depending on the degree of the shift. By selecting the two pixel group thus arranged two-dimensionally as the reference pixels and the examination pixels and comparing the light intensity distributions of the two pixel groups, a parallax can be obtained more accurately.

Adjacent reference pixels and adjacent examination pixels are preferably interpolated with virtual pixels. In the interpolation, a spacing between the pixels is divided into, for example, two, three or four (or more). A virtual pixel(s) is inserted into the spacing between the pixels. A light intensity of the virtual pixel is estimated based on the light intensity of actual pixels that surround the virtual pixel. As a result, the first and second light intensity distributions can be detected more accurately, thereby making it possible to quantify parallax more accurately.

[Combination of Images]

Next, image combination of the imaging apparatus of Embodiment 1 will be described.

Figure 13:
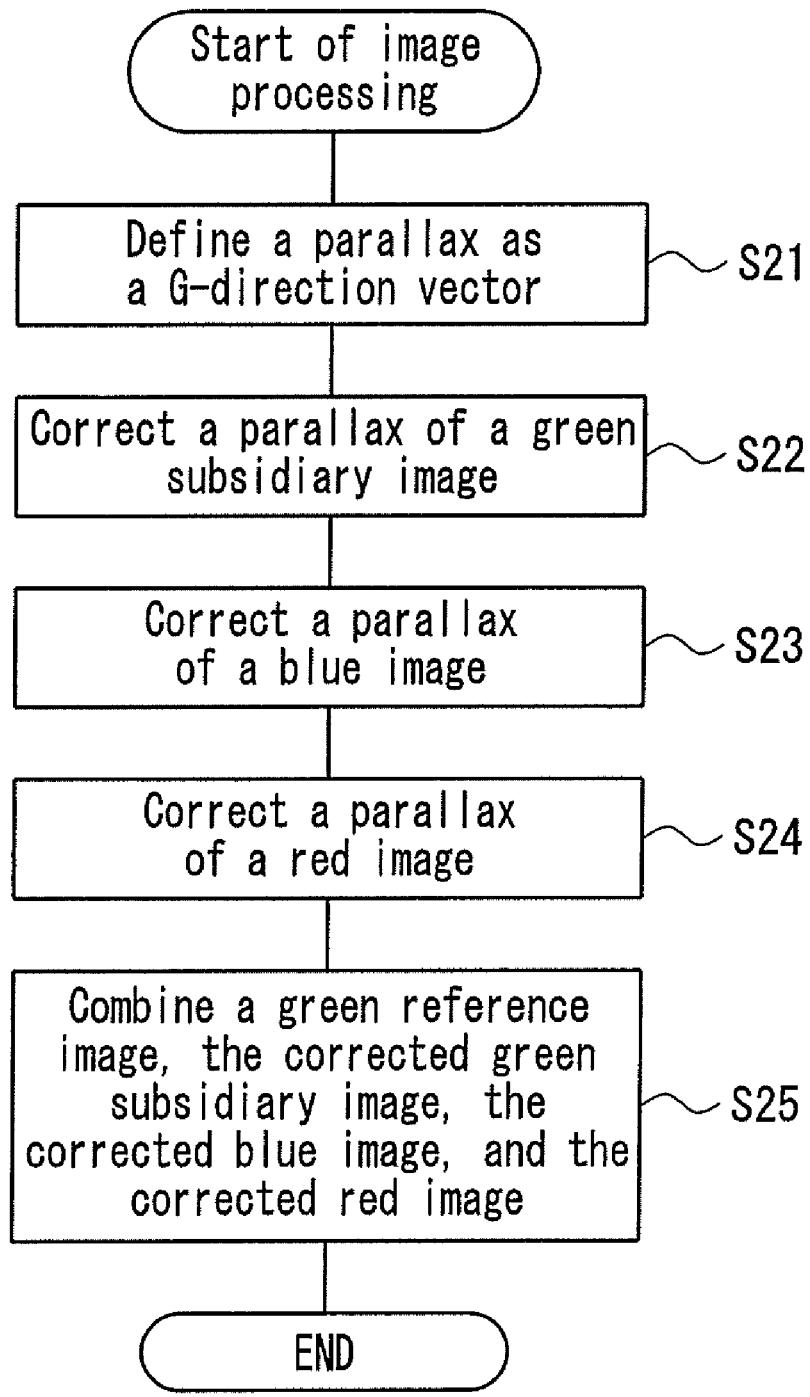
FIG. 13 is a flowchart showing an image processing program of the imaging apparatus of Embodiment 1 of the present invention.

FIG. 13 is a flowchart showing an image processing program of the imaging apparatus of Embodiment 1 of the present invention.

As shown in FIG. 13, when the image processing program is started, in step S21, the parallax quantifying program of FIG. 9 quantifies a displacement of the green subsidiary image with respect to the green reference image due to parallax as a G-direction parallax vector (parallax quantifying step). In step S22, R-direction and B-direction parallaxes of the green subsidiary image are corrected. In step S23, a B-direction parallax of the blue image is corrected. In step S24, an R-direction parallax of the red image is corrected.

Steps S22 to S24 will be specifically described using the case where a parallax is one pixel as in FIG. 11. As described above, the G direction is substantially the same as the diagonal direction, the B direction is substantially the same as the X direction, and the R direction is substantially the same as the Y direction. Therefore, when a parallax is as small as one pixel, the correction of the G-direction parallax is substantially the same as the correction of the diagonal direction, the correction of the B-direction parallax is substantially the same as the correction of the X-direction parallax, and the correction of the R-direction parallax is substantially the same as the correction of the Y-direction parallax. By moving the green subsidiary image by one pixel in a direction opposite to the B direction (−X direction) and by one pixel in a direction opposite to the R direction (−Y direction), the parallax of the green subsidiary image is corrected. In other words, pixel data at coordinates (m, n) of the imaging sensor 106 in the green subsidiary image substitute for pixel data at coordinates (m−1, n−1). Also, by moving the blue image by one pixel in a direction opposite to the B direction (−X direction), the parallax of the blue image is corrected. In other words, pixel data at coordinates (m, n) of the imaging sensor 108 of the blue image substitute for pixel data at coordinates (m−1, n). Further, by moving the red image by one pixel in a direction opposite to the R direction (−Y direction), the parallax of the red image is corrected. In other words, pixel data at coordinates (m, n) of the imaging sensor 105 of the red image substitute for pixel data at coordinates (m, n−1).

However, when a object is close to the imaging apparatus so that a parallax is large, it is necessary to consider a slight difference between the B direction and the X direction, a slight difference between the R direction and the Y direction, and a slight difference between the G direction and the diagonal direction. For example, when the B direction is tilted with respect to the X direction by 5 degrees, when the X direction needs to be corrected by 11 or 12 pixels, at the same time, the Y direction needs to be corrected by one pixel.

As a result, the parallaxes of the green subsidiary image, the red image and the blue image are eliminated or considerably reduced. In step S25, the green reference image and the corrected green subsidiary image, blue image and red image are combined. Since the pixel data of an image are corrected so that a parallax is reduced or eliminated in each of the red image, the blue image and the green subsidiary image, a sharp color combined image is obtained.

Alternatively, since the green reference image and the green subsidiary image are substantially the same image, the green reference image and the corrected blue image and red image are combined to obtain substantially the same sharp color combined image without using the corrected green subsidiary image.

[Drive Means]

A function, such as focus control, operator jitters free, magnified picture (zoomed picture), close-up picture (macro picture) or the like, is also required for an imaging apparatus that is mounted in a mobile phone or the like. In order to achieve these functions, relative positions of a lens system and an imaging sensor need to be changed in a direction perpendicular or parallel to an optical axis of the lens system. The imaging apparatus of Embodiment 1 has a three-dimensional drive means that can move minutely an imaging sensor in the Z, X and Y directions of FIG. 1 separately. A structure and a function of the three-dimensional drive means will be described with reference to FIGS. 14 to 19.

Figure 14:
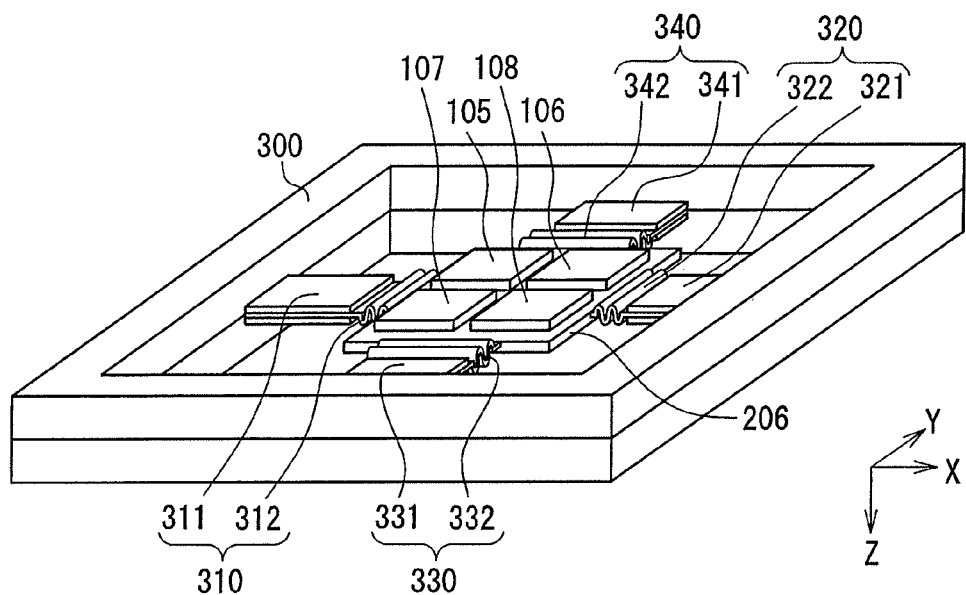
FIG. 14 is a perspective view showing a three-dimensional drive means of the imaging apparatus of Embodiment 1 of the present invention.
Figure 15:
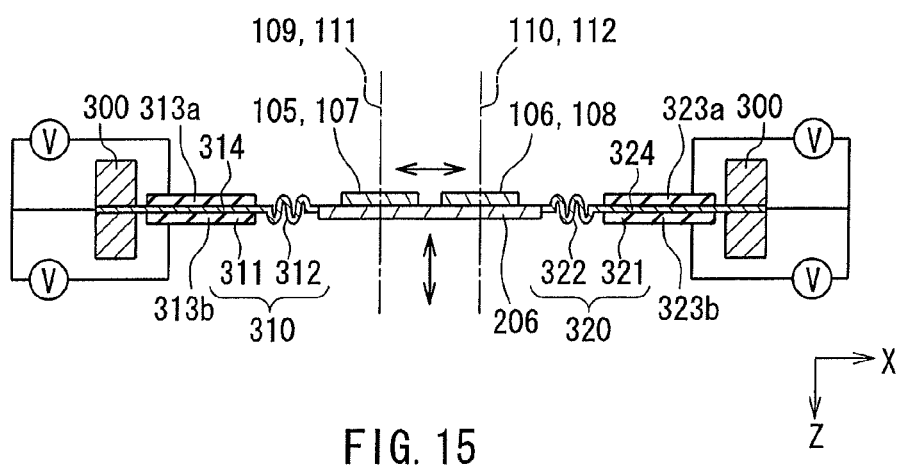
FIG. 15 is a cross-sectional view of an actuator constituting the three-dimensional drive means in the imaging apparatus of Embodiment 1 of the present invention.
Figure 16:
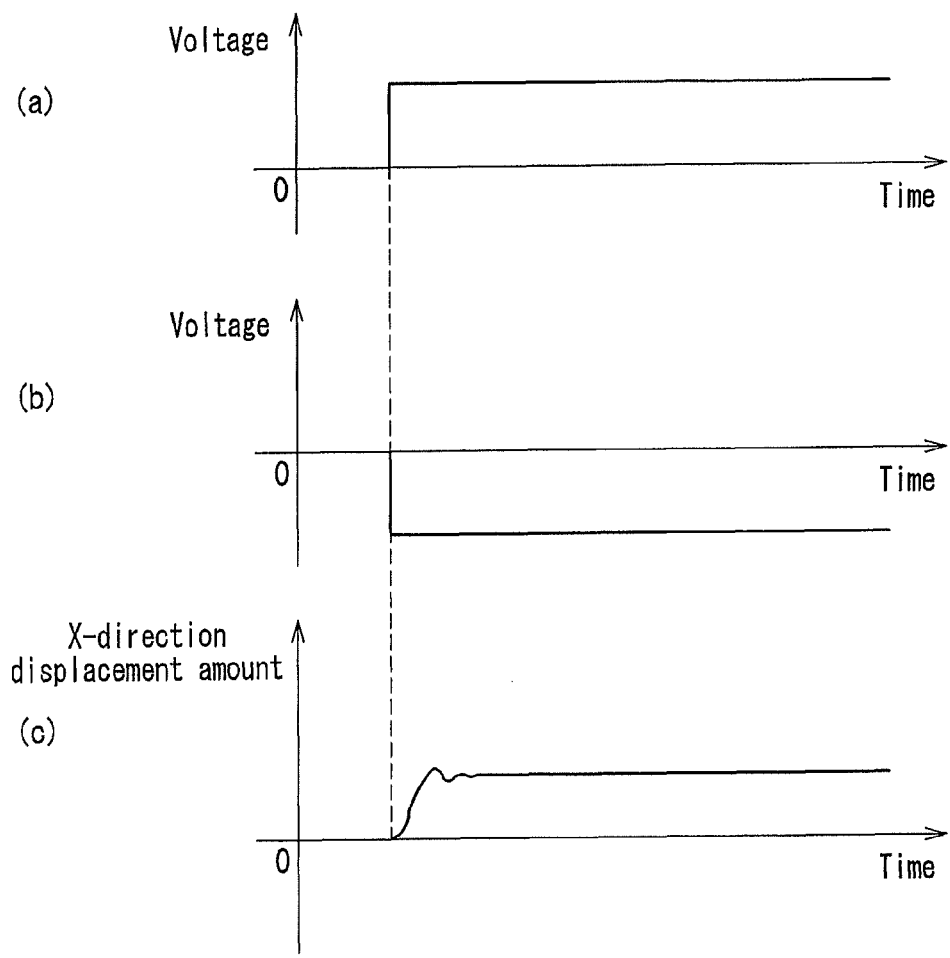
FIG. 16 is a diagram showing an actuator drive method of the imaging apparatus of Embodiment 1 of the present invention.
Figure 17:
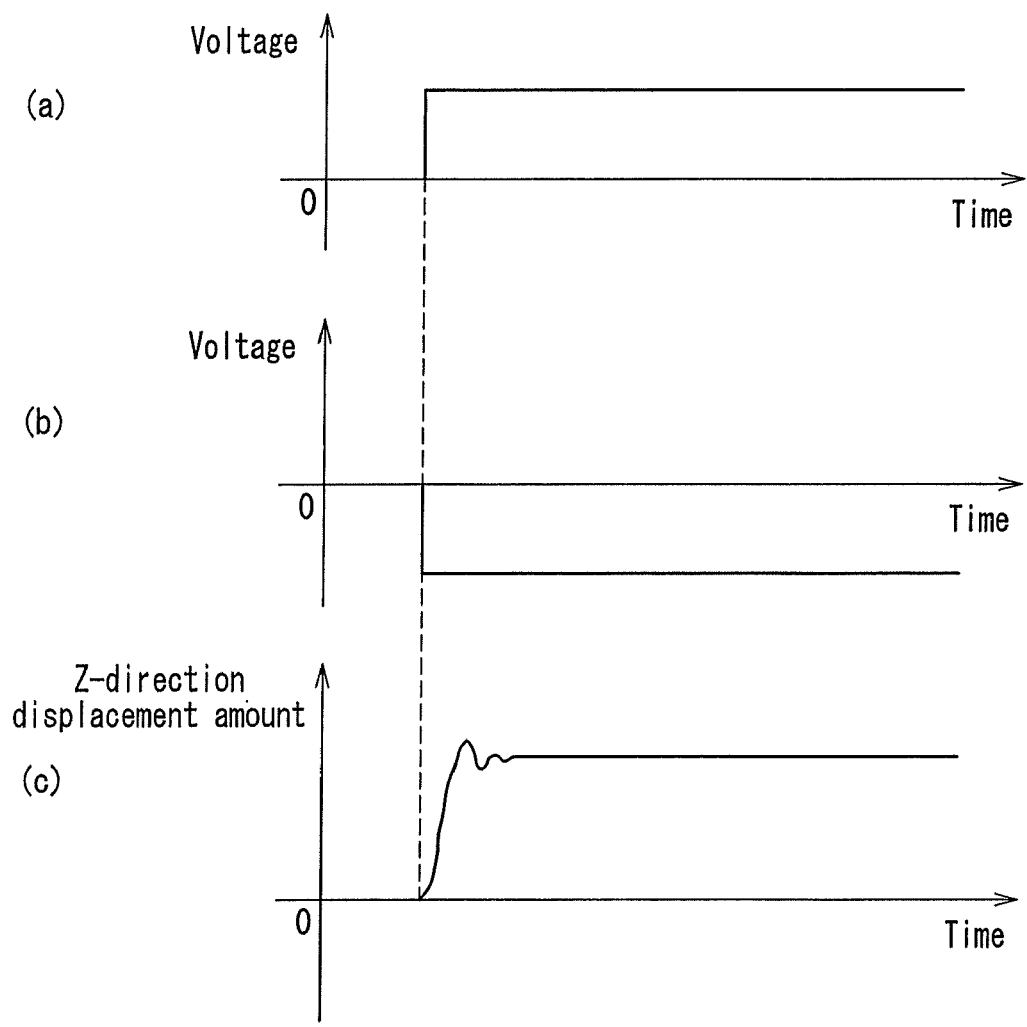
FIG. 17 is a diagram showing another actuator drive method of the imaging apparatus of Embodiment 1 of the present invention.
Figure 18:
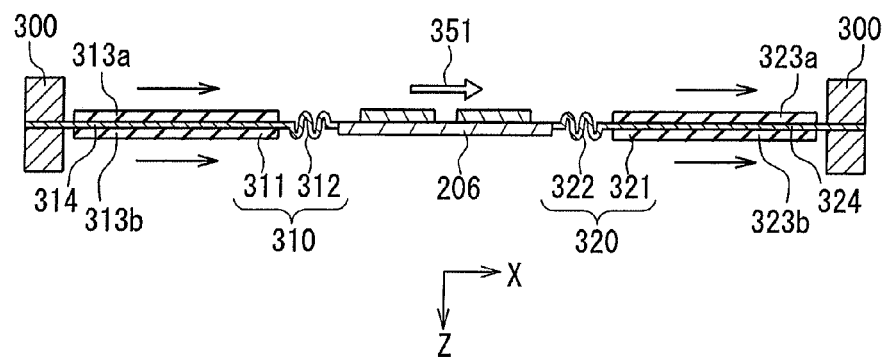
FIG. 18 is a diagram showing an operation of the actuator in the imaging apparatus of Embodiment 1 of the present invention.
Figure 19:
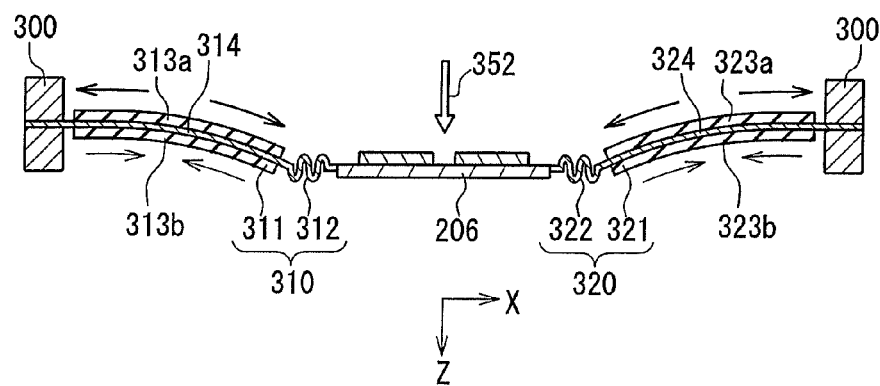
FIG. 19 is a diagram showing another operation of the actuator in the imaging apparatus of Embodiment 1 of the present invention.
Figure 20:
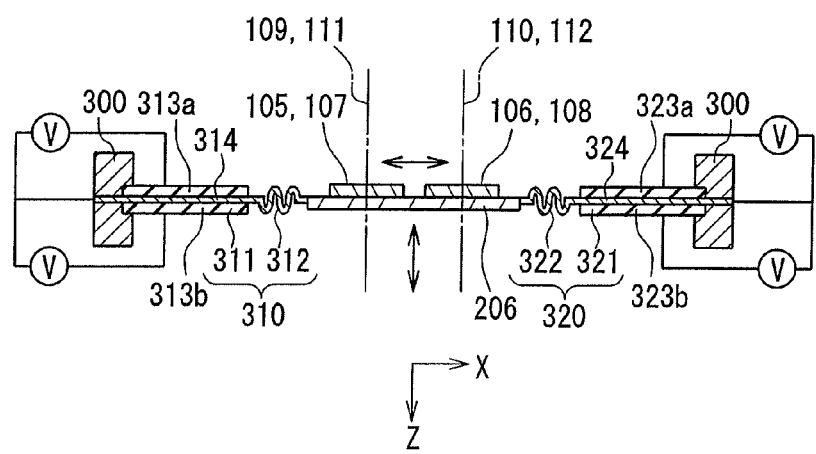
FIG. 20 is a cross-sectional view of another actuator for the imaging apparatus of Embodiment 1 of the present invention.

FIG. 14 is a perspective view showing the three-dimensional drive means of the imaging apparatus of Embodiment 1 of the present invention. FIG. 15 is a cross-sectional view of an actuator constituting the three-dimensional drive means in the imaging apparatus of Embodiment 1 of the present invention. FIGS. 16 and 17 are diagrams each showing an actuator drive method of the imaging apparatus of Embodiment 1 of the present invention. FIGS. 18 and 19 are diagrams each showing an operation of the actuator in the imaging apparatus of Embodiment 1 of the present invention. FIG. 20 is a cross-sectional view of another actuator for the imaging apparatus of Embodiment 1 of the present invention. In FIGS. 14 to 20, the same components as those in FIGS. 1 to 13 are indicated with the same reference numerals and will not be explained.

In FIG. 14, 206 indicates a substrate including a computing apparatus, on which imaging sensors 105, 106, 107 and 108 are disposed. 310 and 320 indicate a first actuator and a second actuator that are disposed across the substrate 206 in the X direction. 330 and 340 indicate a third actuator and a fourth actuator that are disposed across the substrate 206 in the Y direction. The first to fourth actuators 310, 320, 330 and 340 are disposed on a plane parallel to the XY plane and at intervals of 90 degrees around a center of the substrate 206.

The first to fourth actuators 310, 320, 330 and 340 have the same structure. The first, second, third and fourth actuators 310, 320, 330 and 340 comprise oscillators 311, 321, 331 and 341 and elastic spring portions 312, 322, 332 and 342 that are connected to each other, respectively. Edges on the oscillators 311, 321, 331 and 341 sides of the first, second, third and fourth actuators 310, 320, 330 and 340 are fixed to a support portion 300. Edges on the elastic spring portions 312, 322, 332 and 342 sides of the first, second, third and fourth actuators 310, 320, 330 and 340 are connected to the substrate 206. The support portion 300 may be a portion of the housing 207 of FIG. 2 or 3.

In FIG. 15, the oscillator 311 is composed of an elastic shim material 314 made of a conductive elastic material, on both sides of which piezoelectric elements 313a and 313b are attached. The elastic shim material 314 extends between the support portion 300 and the substrate 206. A portion of the elastic shim material 314 forms the elastic spring portion 312, the portion projecting from the oscillator 311 toward the substrate 206. Similarly, the oscillator 321 is composed of an elastic shim material 324 made of a conductive elastic material, on both sides of which piezoelectric elements 323a and 323b are attached. The elastic shim material 324 extends between the support portion 300 and the substrate 206. A portion of the elastic shim material 324 forms the elastic spring portion 322, the portion projecting from the oscillator 321 toward the substrate 206.

The piezoelectric elements 313a, 313b, 323a and 323b are applied with a polarization in the thickness direction (Z direction) and electrodes (not shown) are formed on top and bottom surfaces thereof. Thereafter, the piezoelectric elements 313a, 313b, 323a and 323b are attached to the elastic shim materials 314 and 324 using an adhesive or the like. The direction of the polarization may be determined, taking into account a relationship between the polarization and an applied electrical signal. In this embodiment, the direction of the polarization coincides with directions facing toward the elastic shim materials 314 and 324 that are neutral surfaces. Therefore, a pair of piezoelectric elements attached to the top and bottom surfaces of the elastic shim materials 314 and 324 have polarization directions opposite to each other.

The elastic spring portions 312 and 322 are formed by corrugating the elastic shim materials 314 and 324, respectively. Although the elastic spring portions 312 and 322 are herein corrugated, a coil spring form can provide a similar effect. Alternatively, the elastic shim materials 314 and 324 may be shaped by, for example, etching a portion thereof to create a narrow portion or a thin portion, thereby conferring a spring property. In this case, a similar effect can be expected.

Side edges of the oscillators 311 and 321 of the first and second actuators 310 and 320 are fixed to the support portion 300 in a manner such that the piezoelectric elements are not interposed in the support portion 300 and only the elastic shim materials 314 and 324 are interposed in the support portion 300. The reason is as follows. If the piezoelectric element is held directly by the support portion 300, a significantly great stress is generated in the piezoelectric element interposed in an edge portion on the oscillator 311, 321 side of the support portion 300 when the oscillators 311 and 321 are vibrated, resulting in a possibility that the stress easily exceeds the breaking point of the piezoelectric element. By holding a portion of the elastic shim materials 314 and 324 on which the piezoelectric element is not attached, using the support portion 300, it is possible to prevent the fracture of the piezoelectric element during vibration, thereby significantly improving the reliability of the apparatus.

Next, an operation of the imaging apparatus will be described. The piezoelectric elements 313a and 313b are applied with a polarization in a manner that obtains the following effect. When a signal shown FIG. 16(a) is applied between the electrodes on the outer surfaces of the piezoelectric elements 313a and 313b adhered to the top and bottom surfaces of the oscillator 311 of the first actuator 310 and the elastic shim material 314 (electrodes on the elastic shim material 314 side of the piezoelectric elements 313a and 313b are adhered to the elastic shim material 314 to be conductive with the elastic shim material 314), both the piezoelectric elements 313a and 313b are extended depending on a potential of the signal. Therefore, as shown in FIG. 18, the oscillator 311 is deformed to increase a length thereof. On the other hand, the piezoelectric elements 323a and 323b are applied with a polarization in such a manner that the following effect can be obtained. When a signal shown FIG. 16(b) is applied between the electrodes on the outer surfaces of the piezoelectric elements 323a and 323b adhered to the top and bottom surfaces of the oscillator 321 of the second actuator 320 and the elastic shim material 324, both the piezoelectric elements 323a and 323b are contracted depending on a potential of the signal. Therefore, as shown in FIG. 18, the oscillator 321 is deformed to decrease a length thereof. The above-described deformation of the oscillators 311 and 321 causes the substrate 206 interposed between the oscillators 311 and 321 in the X-axis direction and the imaging sensors 105, 106, 107 and 108 provided thereon to be moved in a direction (the positive X-axis direction) indicated with arrow 351 in FIG. 18, exhibiting a displacement behavior shown in FIG. 16(c). A ringing phenomenon existing in FIG. 16(c) is caused by resonance of the oscillators 311 and 321, and can be relaxed by reducing a rising rate of a voltage applied to the piezoelectric element. Further, by applying a drive signal having a polarity reverse to that described above to the piezoelectric element, it is possible to move the substrate 206 and the imaging sensor in a direction reverse to that of arrow 351 of FIG. 18.

Further, a signal shown in FIG. 17(a) is applied between the electrode on the outer surface of the piezoelectric element 313a in the oscillator 311 of the first actuator 310 and the elastic shim material 314, while a signal shown in FIG. 17(b) is applied between the electrode on the outer surface of the piezoelectric element 313b and the elastic shim material 314. In this case, the piezoelectric element 313a is extended, while the piezoelectric element 313b is contracted. Thus, the oscillator 311 is bent and deformed as shown in FIG. 19. Further, the signal of FIG. 17(a) is applied between the electrode on the outer surface of the piezoelectric element 323a in the oscillator 321 of the second actuator 320 and the elastic shim material 324, while the signal of FIG. 17(b) is applied between the electrode on the outer surface of the piezoelectric element 323b and the elastic shim material 324. In this case, the piezoelectric element 323a is extended, while the piezoelectric element 323b is contracted. Thus, the oscillator 321 is bent and deformed in the same direction as that of the oscillator 311 as shown in FIG. 19. The effect of the elastic spring portions 312, 322 causes the substrate 206 interposed between the oscillators 311 and 321 and the imaging sensors 105, 106, 107 and 108 provided thereon to be moved in a direction (the positive Z-axis direction) indicated with arrow 352 in FIG. 19, exhibiting a displacement behavior shown in FIG. 17(c) while keeping the horizontal state. A ringing phenomenon existing in FIG. 17(c) is caused by resonance of the oscillators 311 and 321, and can be relaxed by reducing a rising rate of a voltage applied to the piezoelectric element. Further, by applying a drive signal having a polarity reverse to that described above to the piezoelectric element, it is possible to move the substrate 206 and the imaging sensor in a direction reverse to that of arrow 352 of FIG. 19.

Thus, the first and second actuators 310 and 320 that surround the substrate 206 in the X direction can be used to move the imaging sensors 105, 106, 107 and 108 in a direction perpendicular to the optical axis of the lens system (the X direction) and in a direction parallel to the optical axis of the lens system (the Z direction).

Therefore, as shown in FIG. 14, by holding the substrate 206 using the first to fourth actuators 310, 320, 330 and 340 that are disposed on the XY plane and at intervals of 90 degrees around the substrate 206 as a center, the imaging sensors 105, 106, 107 and 108 can be moved in a direction parallel to the optical axis of the lens system (the Z direction) and in two directions that are perpendicular to the optical axis of the lens system and are perpendicular to each other (the X direction and the Y direction). As a result, various functions can be conferred on the imaging apparatus.

The piezoelectric element may be interposed in the support portion 300, depending on the degree or frequency of vibration. This example is shown in FIG. 20.

In the above description, any one of a pair of the first and second actuators 310 and 320 and a pair of the third and fourth actuators 330 and 340 can be omitted so that the imaging sensors 105, 106, 107 and 108 is moved in a direction parallel to the optical axis of the lens system (the Z direction) and a direction perpendicular to the optical axis of the lens system (the X direction or the Y direction).

Alternatively, the single lenses 101, 102, 103 and 104 may be held using the above-described actuator so that the single lenses 101, 102, 103 and 104 can be moved with respect to the housing 207 instead of the imaging sensors 105, 106, 107 and 108.

[Focus Control Function]

Firstly, a focus control function of the imaging apparatus of Embodiment 1 will be described among the various functions thereof.

When a object is located at a distance from the imaging apparatus, the imaging sensor provided at the focus position of each single lens can be used to take a focused image. As the object approaches the imaging apparatus, the imaging sensor needs to be moved from the focus position of each single lens. The three-dimensional drive means composed of the first to fourth actuators 310, 320, 330 and 340 of FIGS. 14 and 15 (or FIG. 20) can be used to cause the imaging sensor to move in the Z direction as shown in FIG. 19, thereby taking a focused image.

[Camera Jitters Free Function]

Next, an operator jitters free function of the imaging apparatus of Embodiment 1 will be described.

Figure 21:
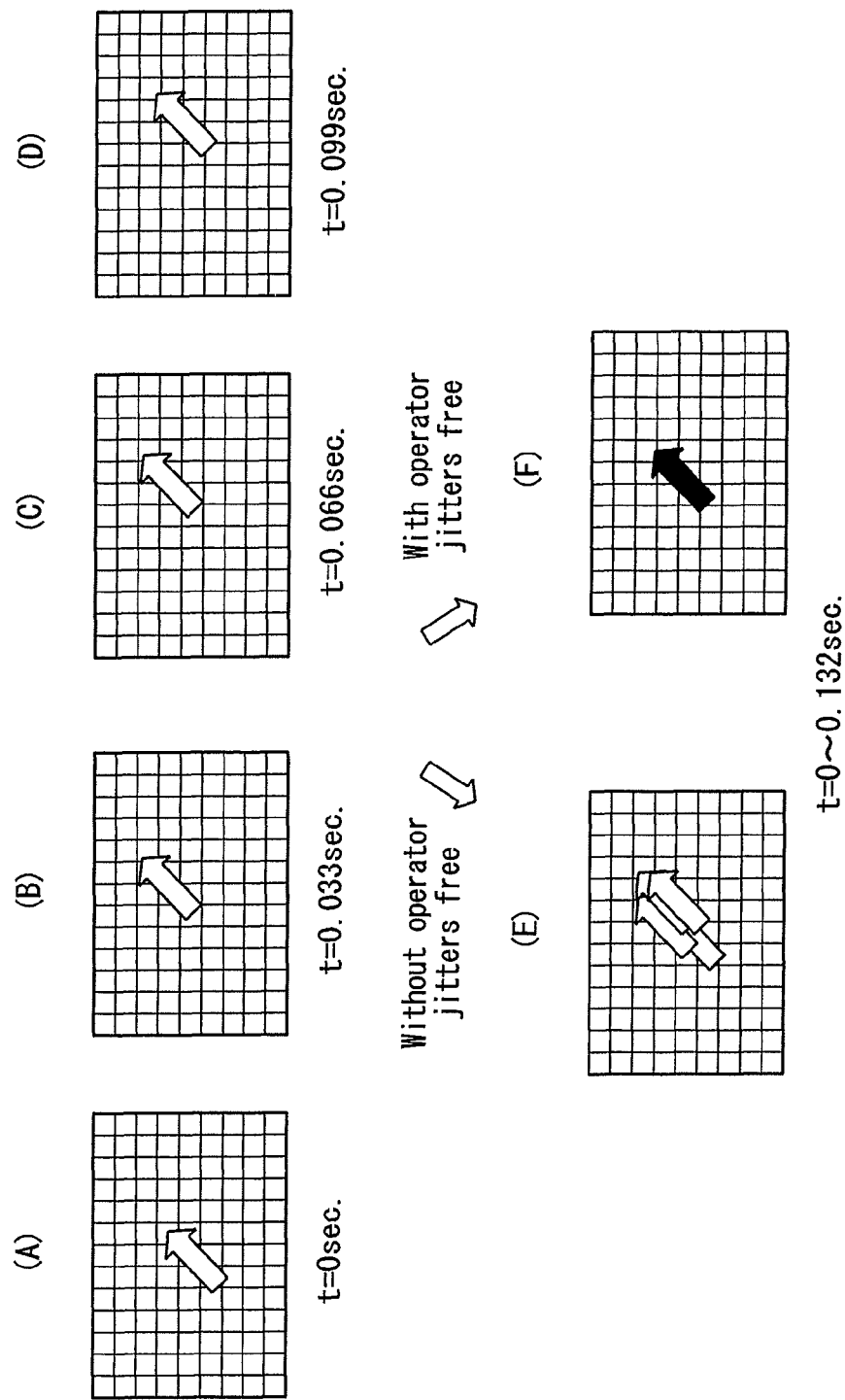
FIG. 21 is a diagram showing an operator jitters free method of the imaging apparatus of Embodiment 1 of the present invention.

FIG. 21 is a diagram showing an operator jitters free method of the imaging apparatus of Embodiment 1 of the present invention.

In the imaging apparatus of Embodiment 1, operator jitters free does not require the three-dimensional drive means of FIGS. 14 to 20, and an electronic jitters free method is used. It is assumed that 30 frames can be captured per second. It takes about 0.033 seconds to capture one image. In the bright environment, a sufficiently sharp image can be captured within this capturing time. However, in the dark environment, the capturing time of about 0.033 seconds is not sufficient and a longer capturing time is required. In this case, operator jitters is highly likely to occur within this capturing time, leading to a possibility that a sharp image is not obtained. To avoid this, the following imaging method is employed. In the dark environment, an image is captured every about 0.033 seconds (a plurality of times). Four images captured by the imaging sensors 105, 106, 107 and 108 at each time are combined to obtain a plurality of color images that are in one-to-one correspondence with the imaging operations. The color image at each of the plurality of times can be obtained using the image combination described with reference to FIGS. 8 to 13. Next, the color images obtained at the plurality of times are compared and superposed in a manner such that matching portions between each image overlap each other. As a result, a sharp color image without operator jitters is obtained.

Camera jitters free will be described with reference to FIG. 21. Four images that are captured by the imaging sensors 105, 106, 107 and 108 in the first imaging operation (t=0 seconds) are combined to produce a first combined color image (A). After about 0.033 seconds have passed, four images that are captured by the imaging sensors 105, 106, 107 and 108 in the second imaging operation (t=0.033 seconds) are combined to produce a second combined color image (B). After another about 0.033 seconds have passed, four images that are captured by the imaging sensors 105, 106, 107 and 108 in the third imaging operation (t=0.066 seconds) are combined to produce a third combined color image (C). After another about 0.033 seconds have passed, four images that are captured by the imaging sensors 105, 106, 107 and 108 in the fourth imaging operation (t=0.099 seconds) are combined to produce a fourth combined color image (D). The position of the object varies among the first to fourth combined color images (A) to (D) due to operator jitters. The first to fourth combined color images (A) to (D) are compared, and are moved to be further combined in a manner such that matching portions between each image overlap each other. As a result, even when the object moves for about 0.132 seconds from the first to fourth imaging operations, a sharp color image is obtained as shown in (F). These signal processes are performed by the substrate 206 including a computing apparatus, such as a digital signal processor (DSP) or the like. For comparison, (E) shows an image that is obtained by simply superposing images taken at four times without operator jitters free. The object of the image (E) is not sharp due to operator jitters.

Alternatively, the following imaging method can be used. An image is captured every about 0.033 seconds (a plurality of times). A plurality of images captured by each of the imaging sensors 105, 106, 107 and 108 at the plurality of times are compared, and are moved to be further combined in a manner such that matching portions between each image overlap each other. As a result, jitters free four single-color images that are in one-to-one correspondence with the four imaging sensors are obtained. Next, the four single-color images are used to perform the image combination described with reference to FIGS. 8 to 13, thereby obtaining a jitters free color image. In this case, when a plurality of images captured by the same imaging sensor at different times are superposed to obtain a jitters free single-color image, a coordinate relationship needs to be matched between each imaging sensor. To achieve this, for example, the first capturing time is used as a reference time common to the four imaging sensors. The images captured at the second and subsequent capturing times are moved to match the first image while keeping the coordinates of the first captured image, thereby successively superposing the images over the first image. As a result, parallax detection, parallax correction, and combination of parallax-corrected images can be performed while keeping a coordinate relationship among the four imaging sensors on the coordinates at the first time. Needless to say, the reference time is not limited to the first capturing time and may be the other capturing times. This operator jitters free method will be described with reference to FIG. 21 as follows. The images (A) to (D) are captured images at the first to fourth capturing times with respect to any one of the four imaging sensor, and the image (F) is a jitters free single-color image that is obtained by combining the images (A) to (D) in a manner such that matching portions among the images (A) to (D) overlap each other while keeping the coordinates of the first captured image (A).

In the above description, operator jitters free is performed using images captured at different times (four times) as an example. The number of times of capturing images is not limited to four. Needless to say, operator jitters free may be performed using images captured at different times (a plurality of times), such as two, three, or five or more.

[Magnified Picture Function]

Next, a magnified picture (zoomed picture) function will be described. In the imaging apparatus of Embodiment 1, a sharp magnified image is obtained electronically without increasing an optical magnification factor. To achieve this, each imaging sensor needs to be moved in a direction perpendicular to the optical axis of the corresponding single lens using the three-dimensional drive means described with reference to FIGS. 14 to 20.

Figure 22A:
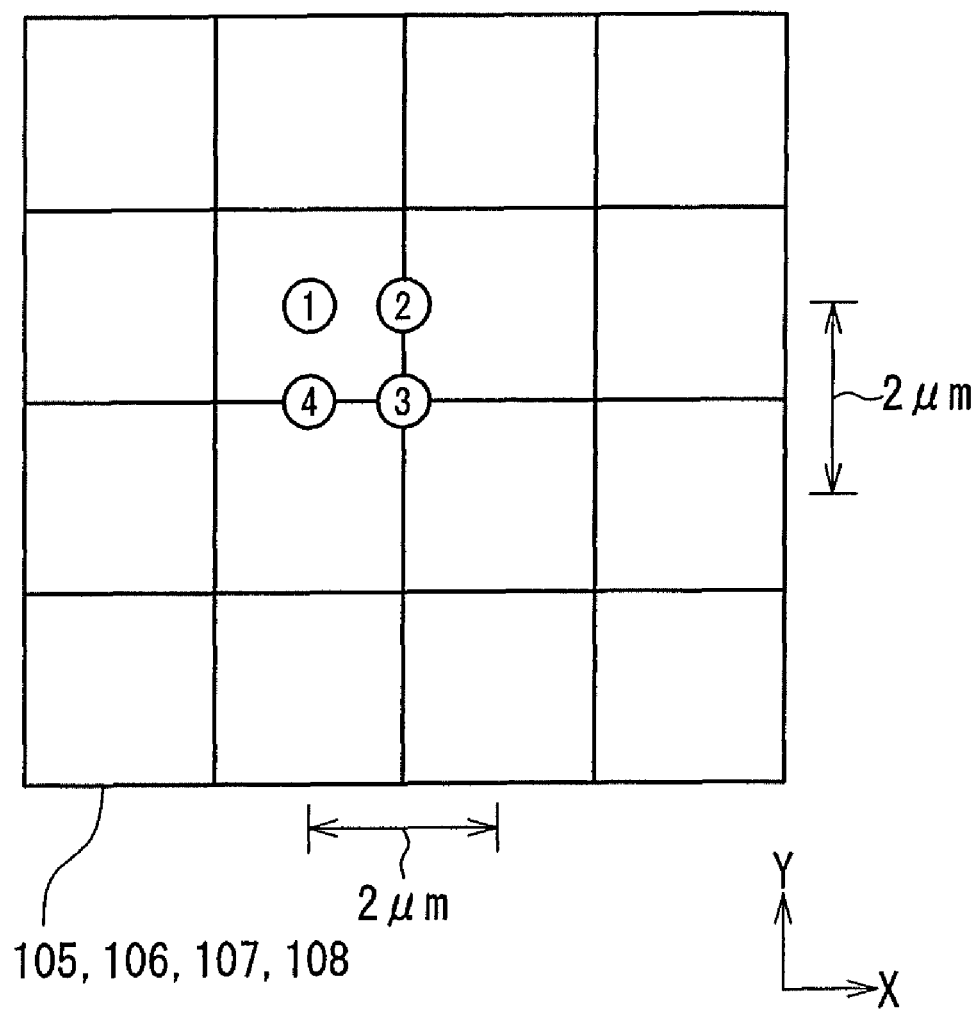
FIGS. 22A and 22B are diagrams for explaining an electronic zoomed picture method of the imaging apparatus of Embodiment 1 of the present invention.
Figure 22B:
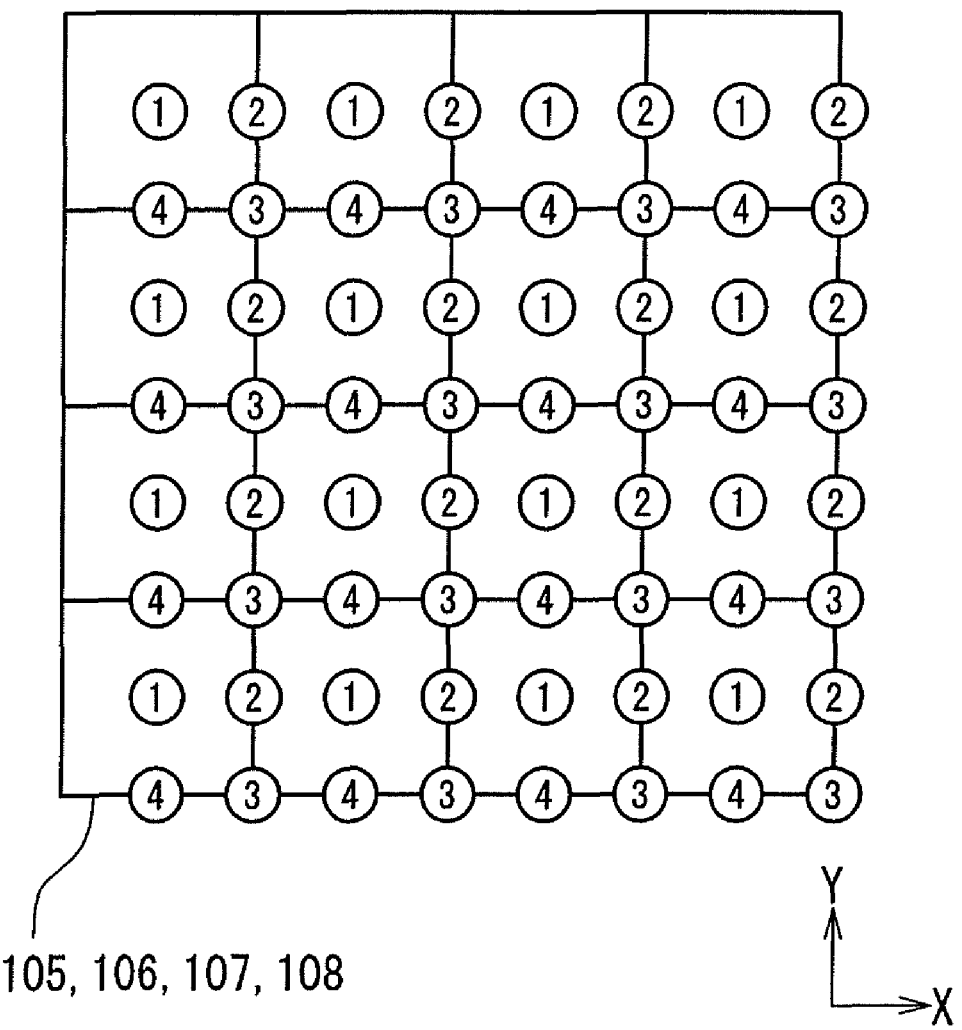

FIGS. 22A and 22B are diagrams for explaining an electronic zoomed picture method of the imaging apparatus of Embodiment 1 of the present invention. In FIGS. 22A and 22B, the same components as those of FIGS. 1 to 20 are indicated with the same reference numerals and will not be explained.

In FIGS. 22A and 22B, each square separated by solid grid lines indicates a pixel. FIG. 22A shows a portion of the imaging sensors 105, 106, 107 or 108. A particular pixel included in the imaging sensor (this pixel is referred to as a "pixel of interest") has a center viewed from the lens system corresponding to the imaging sensor, which is represented by "1". For example, a center-to-center spacing between each pixel is assumed to be 2 μm. The imaging sensors 105, 106, 107 and 108 are provided at the focus positions of the respective single lenses and are caused to be ready to capture a considerably distant object. Thereafter, an image is captured a plurality of times while moving the imaging sensors 105 to 108 in the X and Y directions by a half of the center-to-center pixel spacing (in this example, 1 μm). It is assumed that 30 frames can be captured per second. It takes about 0.03 seconds to capture one image. A first image is captured. In this case, the center of the pixel of interest viewed from the lens system is located at the position "1" of FIG. 22A. At this time point, four images captured by the imaging sensors 105, 106, 107 and 108 are combined to produce a first color image. Thereafter, the imaging sensors 105 to 108 are moved in the X direction by 1 μm quickly (e.g., within 0.003 seconds). In this case, the center of the pixel of interest viewed from the lens system is moved to a position "2" in FIG. 22A. In this state, a second image is captured. At this time point, four images captured by the imaging sensors 105, 106, 107 and 108 are combined to produce a second color image. Thereafter, the imaging sensors 105 to 108 are moved in the −Y direction by 1 μm quickly. In this case, the center of the pixel of interest viewed from the lens system is moved to a position "3" in FIG. 22A. In this state, a third image is captured. At this time point, four images captured by the imaging sensors 105, 106, 107 and 108 are combined to produce a third color image. Further, the imaging sensors 105 to 108 are moved in the −X direction by 1 μm quickly. In this case, the center of the pixel of interest viewed from the lens system is moved to a position "4" in FIG. 22A. In this state, a fourth image is captured. At this time point, four images captured by the imaging sensors 105, 106, 107 and 108 are combined to produce a fourth color image. FIG. 22B shows a superimposed movement trace of the centers of all the pixels viewed from the lens system, when the first, second, third and fourth images are captured. As can be seen, the number of pixels is apparently increased by a factor of four as though a pixel were provided between vertically or horizontally adjacent pixels. When the above-described first, second, third and fourth color captured images are further combined, a color image having a resolution four times that of the imaging sensors 105 to 108 can be obtained.

Specifically, in order to image a considerably distant object, the imaging sensors 105 to 108 located at the imaging position are moved in the X and Y directions by a half of the center-to-center spacing between adjacent light receiving portions (a half of the center-to-center spacing between adjacent pixels) to capture an image thereof four times. Single-color images captured at each time are combined to produce four color images. These image combinations are performed using the method described with reference to FIGS. 9 to 13. The four color images are further combined to obtain a combined color image having a 4-fold resolution. Any one-fourth area that is arbitrarily taken out from the combined color image can be a fourfold magnified color image (zoomed picture) having the same resolution as that of the imaging sensors 105 to 108 (i.e., without a degradation in resolution). The above-described signal processing is performed by the substrate 206 including a computing apparatus, such as a digital signal processor (DSP) and the like (see FIG. 2).

Alternatively, a magnified image can be produced as follows. In this case, it is also assumed that 30 frames can be captured per second. It takes about 0.03 seconds to capture one image. A first image is captured, i.e., the imaging sensors 105, 106, 107 and 108 capture four respective images. In this case, the center of a pixel of interest viewed from the lens system is located at the position "1" of FIG. 22A. Thereafter, the imaging sensors 105 to 108 are moved in the X direction by 1 μm quickly (e.g., within 0.003 seconds). In this case, the center of the pixel of interest viewed from the lens system is moved to the position "2" in FIG. 22A. In this state, a second image is captured, i.e., the imaging sensors 105, 106, 107 and 108 capture four respective images. Thereafter, the imaging sensors 105 to 108 are moved in the −Y direction by 1 μm quickly. In this case, the center of the pixel of interest viewed from the lens system is moved to a position "3" in FIG. 22A. In this state, a third image is captured, i.e., the imaging sensors 105, 106, 107 and 108 capture four respective images. Further, the imaging sensors 105 to 108 are moved in the −X direction by 1 μm quickly. In this case, the center of the pixel of interest viewed from the lens system is moved to a position "4" in FIG. 22A. In this state, a fourth image is captured, i.e., the imaging sensors 105, 106, 107 and 108 capture four respective images. Thereafter, each of the imaging sensors 105 to 108 combines the first to fourth images, resulting in four single-color combined images having a wavelength band different from one another. The four combined images each have a resolution four times that of the image captured by each of the imaging sensors 105 to 108 at each time. The four single-color, high-resolution combined image further are combined to obtain a color image having a resolution four times that of the imaging sensors 105 to 108. This image combination is achieved using the method described with reference to FIGS. 9 to 13. Any one-fourth area that is arbitrarily taken out from the combined color image can be a four-fold magnified color image (zoomed picture) having the same resolution as that of the imaging sensors 105 to 108 (i.e., without a degradation in resolution). The above-described signal processing is performed by the substrate 206 including a computing apparatus, such as a digital signal processor (DSP) and the like (see FIG. 2).

In the above description, the relative positions of the optical system and the imaging sensor are moved four times, i.e., a pixel of interest is moved from "1" to "2" to "3" to "4". Alternatively, it is considered that a pixel of interest is moved two times, e.g., from "1" to "2". In this case, an image having a two-fold resolution in the X direction can be produced. Alternatively, it is also considered that a pixel of interest is moved two times, e.g., from "1" to "4". In this case, an image having a two-fold resolution in the Y direction can be produced. Alternatively, it is also considered that a pixel of interest is moved two times, e.g., from "1" to "3". In this case, an image apparently having a two-fold resolution in each of the X and Y directions can be produced.

EXAMPLES

Here, a specific shape and size of the imaging apparatus of Embodiment 1 will be shown.

Figure 23A:
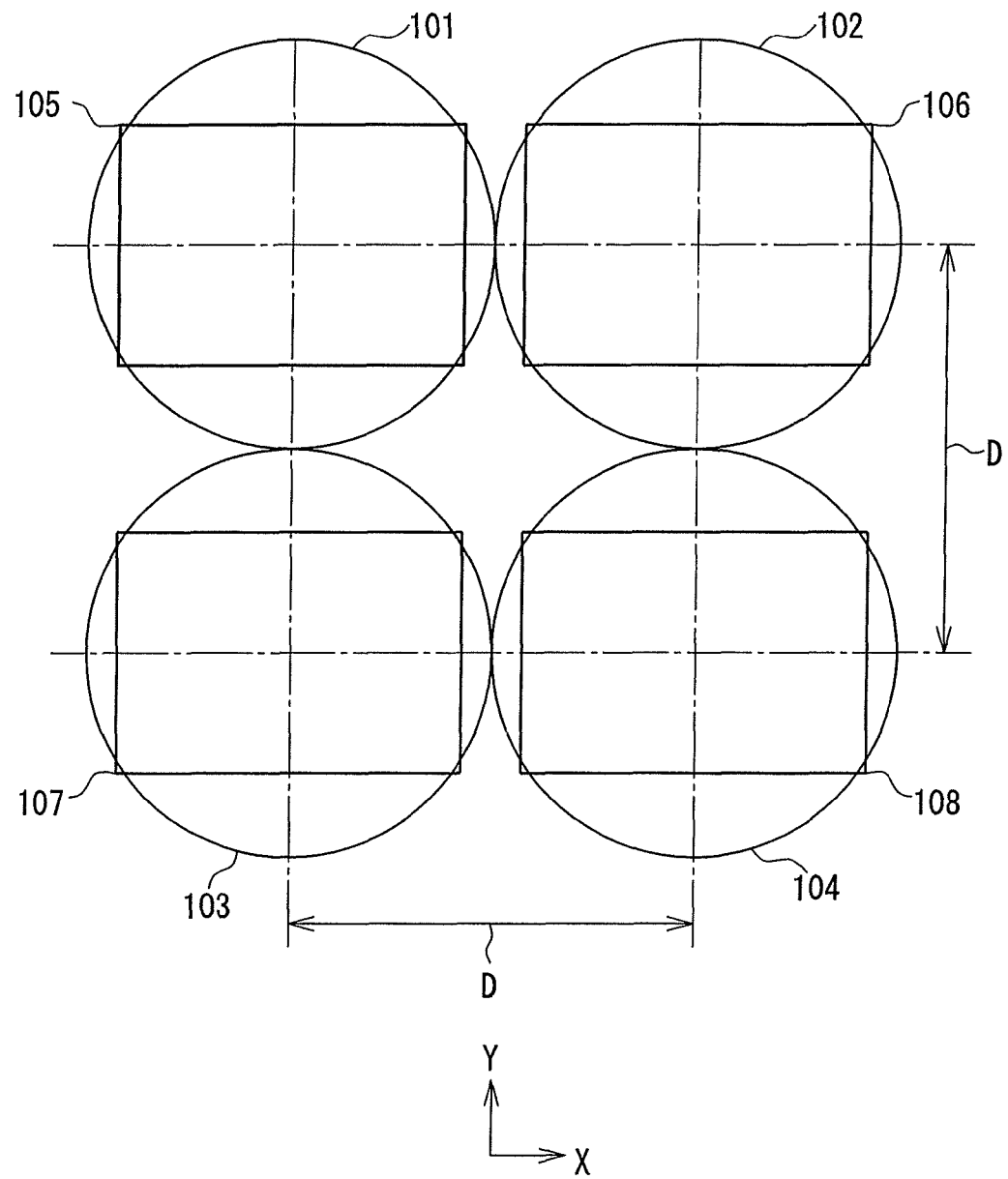
FIG. 23A is a top view of imaging sensors and lens systems according to an example of the imaging apparatus of Embodiment 1 of the present invention.
Figure 23B:
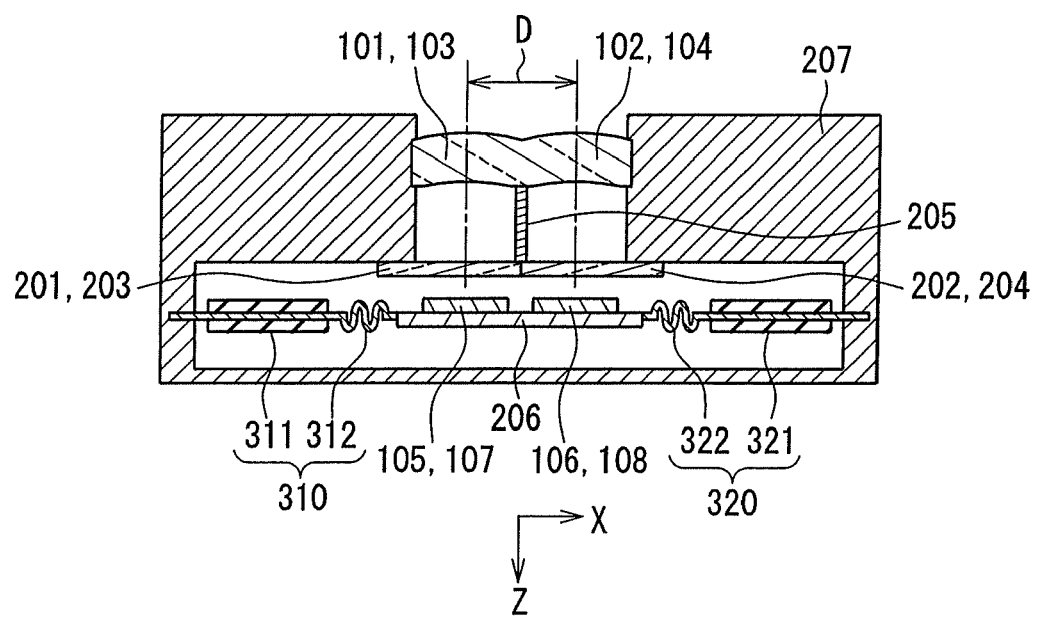
FIG. 23B is a cross-sectional view of the example of the imaging apparatus of Embodiment 1 of the present invention.

FIG. 23A is a top view of imaging sensors and lens systems according to an example of the imaging apparatus of Embodiment 1 of the present invention. FIG. 23B is a cross-sectional view of the example of the imaging apparatus of Embodiment 1 of the present invention. In FIGS. 23A and 23B, the same components as those of FIGS. 1 to 22 are indicated with the same reference numerals and will not be explained.

In FIGS. 23A and 23B, 101, 102, 103 and 104 each indicate an aspherical single lens, which are integrally formed. 207 indicates a housing for the imaging apparatus, to which the integrally formed lens system and the color filters 201, 202, 203 and 204 are fixed. A light shielding plate 205 is provided at a border between adjacent color filters to prevent mixture of light in different wavelength bands. Further, the housing 207 holds one edge of each of first to fourth actuators 310, 320, 330 and 340 comprising an oscillator and an elastic spring portion (in FIG. 23B, only the first and second actuators 310 and 320 are shown). The other edge of each of the first to fourth actuators 310, 320, 330 and 340 is supported by a substrate 206 including a computing apparatus. On the substrate 206, imaging sensors 105, 106, 107 and 108 are provided. Each imaging sensor has 830 rows×1200 columns of pixels (about one million pixels). Each pixel is a square having a side of 2 μm. Therefore, each imaging sensor is a rectangle having an X-direction dimension of 2.4 mm and a Y-direction of 1.66 mm. The diagonal length of each imaging sensor is 2.9 mm. In this exemplary imaging apparatus, both a distance D between the optical axes of adjacent single lenses and a focal length f of each single lens are 2.9 mm.

When a object is located at an infinite distance, an image of the object is taken while the imaging sensors are provided at focusing positions of the respective corresponding single lenses. When the object approaches the imaging apparatus, the imaging sensors are moved away from the respective single lenses in a direction parallel to the optical axes thereof. The movement of the imaging sensor is achieved by bending the oscillators 311, 321, 331 and 341 of the first to fourth actuators as shown in FIG. 19. For example, when a distance A from the imaging apparatus to the object is 20 cm, each imaging sensor is moved by about 43 μm from the focus position thereof since the focal length f of each single lens is 2.9 mm.

By performing image combination (parallax detection, parallax correction, and combination of parallax-corrected images) with respect to images captured by the four imaging sensors as described with reference to FIGS. 9 to 13, a sharp color image is obtained. Specifically, an amount of parallax is estimated. A parallax Δ is calculated according to Δ=D×(f/A). When the object is at a distance of 2.9 m or more from the imaging apparatus (A>2.9 m), the parallax Δ is 3 µm or less, i.e., a size of 1.5 pixels or less. In this case, parallax correction is not required, and images captured by the imaging sensors 105, 106, 107 and 108 are simply combined. When the object is at a distance of 1.7 m to 2.9 m from the imaging apparatus, the parallax Δ is 3 to 5 µm, i.e., a size of 1.5 pixels to 2.5 pixels. In this case, the images are combined after one-pixel parallax correction is performed. For general person pictures, a sharp color image can be obtained by one-pixel parallax correction. For distant views, parallax correction is not required.

Among the oscillators 311, 321, 331 and 341, a pair of oscillators that face each other across the substrate 206 are extended/contracted as shown in FIG. 18, and the imaging sensors are moved together in directions perpendicular to the optical axes of the respective single lenses as shown in FIGS. 22A and 22B. An amount of the movement is 1 µm, which is a half of the pixel spacing. As shown in FIGS. 22A and 22B, the number of pixels in each imaging sensor is apparently 4 million pixels, i.e., a four-fold magnified image can be obtained without a degradation in resolution.

In the above-described imaging apparatus of Embodiment 1, a pair of imaging sensors for capturing a green reference image and a green subsidiary image are disposed on a diagonal line to detect parallax. The present invention is not limited to this. A pair of imaging sensors for capturing a red reference image and a red subsidiary image may be disposed on a diagonal line to detect parallax. A pair of imaging sensors for capturing a blue reference image and a blue subsidiary image may be disposed on a diagonal line to detect parallax.

Although the imaging apparatus of Embodiment 1 comprises four imaging units composed of one optical system and one imaging sensor, the number of imaging units is not limited to four. However, when the number of imaging units is two, light from a object cannot be divided into three primary colors, i.e., red, green and blue wavelength bands, so that no sharp color image is obtained. When the number of imaging units is three, light from a object can be divided into red, green and blue wavelength bands. However, only one image is obtained for each of the red, green and blue wavelength band. In this case, therefore, it is difficult to use the above-described method of the embodiment in which two images in the same wavelength band are compared to detect parallax, i.e., it is difficult to obtain a sharp color image. When the number of imaging units is five or more, an area where these units are disposed is large and the structure is redundant, i.e., it is not efficient.

In the above-described imaging apparatus of Embodiment 1, four separate imaging sensors are used. The imaging sensor receives light from a object and accumulates a signal due to the photoelectric effect. The accumulated signal is transferred to a computing apparatus or the like, in which the signal is in turn subjected to signal processing, such as image combination. In general, a transfer rate of the accumulated signal is decreased with an increase in the number of pixels. By using separate imaging sensors, the accumulated signal of each imaging sensor can be transferred independently, resulting in high-rate signal processing.

Embodiment 2

A diffraction grating lens in which a diffraction grating is formed on a lens surface will be discussed. Blaze diffraction grating is preferable in terms of improved efficiency. However, a blaze diffraction grating that is optimized with respect to a certain wavelength band (e.g., green), has a high diffraction efficiency with respect to the wavelength band, but has a poor efficiency with respect to other wavelength bands (e.g., red or blue), resulting in unnecessary light. Imaging systems need to be highly efficient with respect to all red, green and blue wavelength bands. Therefore, there has been a limit on the use of a diffraction grating in imaging systems.

However, in the imaging apparatus of Embodiment 2, a plurality of lens systems and the same number of imaging sensors are provided in a manner such that the imaging sensors are disposed on the optical axes of the respective lens systems as in Embodiment 1. Each lens system corresponds only to a red, green or blue wavelength band. Therefore, a blazed diffraction grating optimized with respect to each wavelength band can be used.

Figure 24:
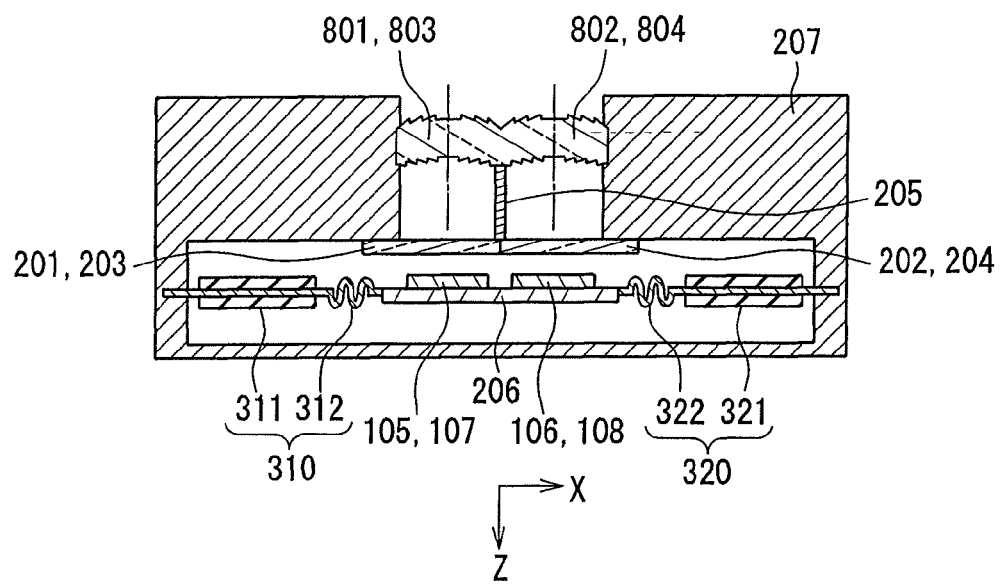
FIG. 24 is a cross-sectional view of an imaging apparatus according to Embodiment 2 of the present invention.

FIG. 24 is a cross-sectional view of an imaging apparatus according to Embodiment 2 of the present invention. The same components as those of FIGS. 1 to 23 are indicated with the same reference numerals and will not be explained.

In FIG. 24, 801, 802, 803 and 804 indicate diffraction grating lenses in each of which a diffraction grating is formed on a surface of a single lens. The other components are the same as those of Embodiment 1 of FIG. 23B, i.e., have the same functions.

In general, diffraction grating lenses can improve distortion of focal plane better than aspherical single lenses. Specifically, when a diffraction grating lens is used, an image having a high resolution can be captured even in a periphery of the imaging sensor, resulting in a sharp image. In addition, the diffraction grating lens can be made thinner than the aspherical lens, thereby making it possible to reduce the thickness of the imaging apparatus. Therefore, a portable equipment, such as a mobile phone or the like, which carries the imaging apparatus, can be made thin.

Embodiment 3

Although four imaging sensors are used in Embodiment 1, a single imaging sensor can be used and divided into four imaging regions.

A structure of an imaging apparatus according to Embodiment 3 of the present invention will be described.

Figure 25:
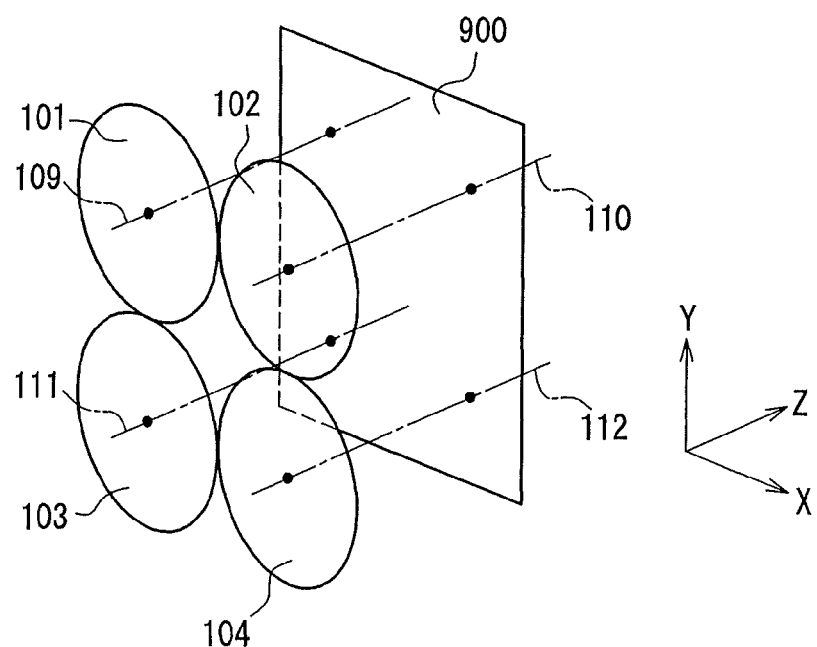
FIG. 25 is a schematic diagram of an imaging apparatus according to Embodiment 3 of the present invention.
Figure 26:
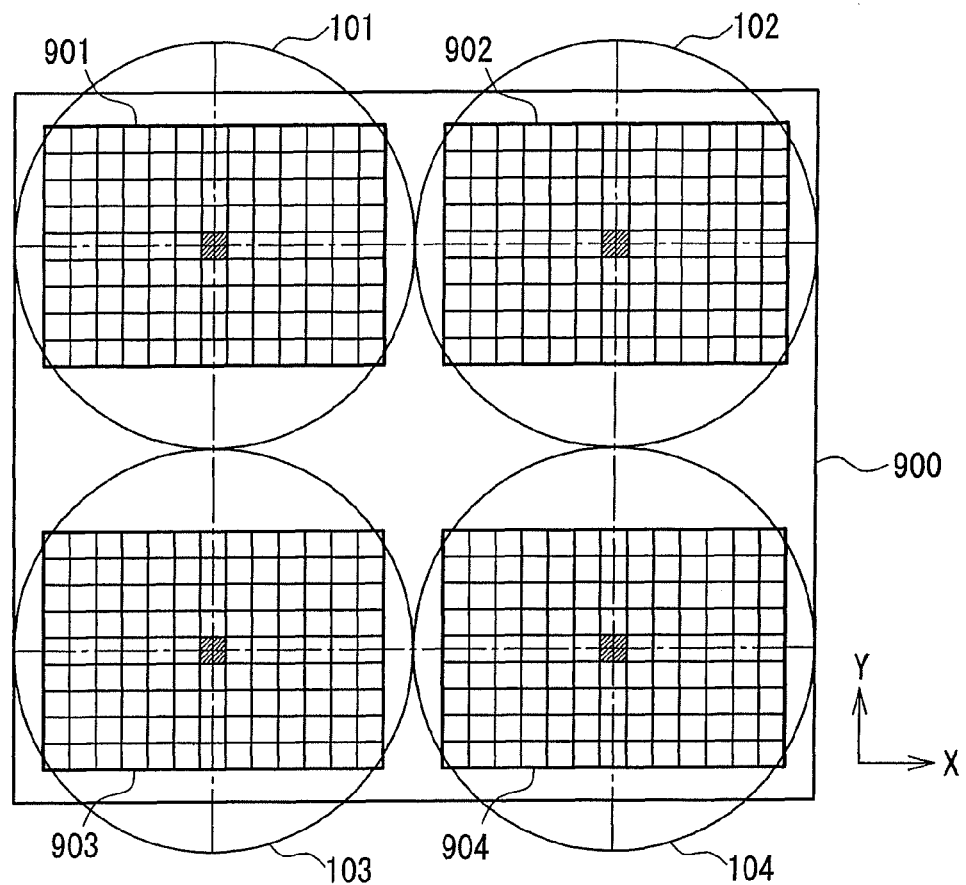
FIG. 26 is a top view showing lens systems and an imaging sensor in the imaging apparatus of Embodiment 3 of the present invention.
Figure 27:
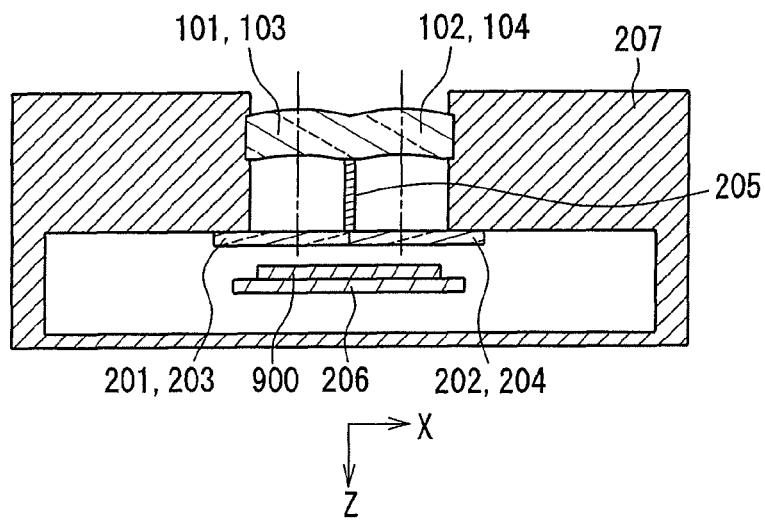
FIG. 27 is a cross-sectional view of the imaging apparatus of Embodiment 3 of the present invention.

FIG. 25 is a schematic diagram of an imaging apparatus according to Embodiment 3 of the present invention. FIG. 26 is a top view showing lens systems and an imaging sensor in the imaging apparatus of Embodiment 3 of the present invention. FIG. 27 is a cross-sectional view of the imaging apparatus of Embodiment 3 of the present invention. In FIGS. 25 to 27, the same components as those of FIGS. 1 to 24 are indicated with the same reference numerals and will not be explained.

In FIG. 25, the imaging apparatus has four single lenses 101, 102, 103 and 104 and a single imaging sensor 900. Similar to FIG. 1, a direction of optical axes 109, 110, 111 and 112 of the single lenses 101, 102, 103 and 104 is referred to as a Z-axis, a direction perpendicular to the Z-axis is referred to as an X-axis, a direction perpendicular to the X-axis and the Z-axis is referred to as a Y-axis. The four single lenses 101, 102, 103 and 104 are constructed integrally, e.g., are formed integrally of glass or plastic. In Embodiment 3, aspherical lenses are used as in Embodiment 1. Alternatively, the diffraction grating lenses 801, 802, 803 and 804 described in Embodiment 2 can be used.

In FIG. 26, the single imaging sensor 900 is divided into four imaging regions 901, 902, 903 and 904. In FIG. 26, only 9 rows×13 columns of pixels are shown in each region, though the imaging sensor is actually composed of more pixels. In general, there are pixels between each imaging region, which are not used or shown in Embodiment 3. The four single lenses 101, 102, 103 and 104 and the imaging sensor 900 are provided in a manner such that the optical axes 109, 110, 111 and 112 of the single lenses 101, 102, 103 and 104 pass in the vicinity of centers of the respective corresponding imaging regions 901, 902, 903 and 904. In each imaging region, a pixel through which the optical axis of the corresponding one of the single lenses 101, 102, 103 and 104 passes is hatched. As in Embodiment 1, the pixels on the optical axes are used as origins to specify the coordinates of pixels in the respective corresponding imaging regions. The origins can be detected using the method shown in FIGS. 6A and 6B. As in Embodiment 1 shown in FIG. 3, the imaging apparatus of Embodiment 3 has one red wavelength band transmitting filter, two green wavelength band transmitting filters, and one blue wavelength band transmitting filter.

In FIG. 27, a color filter is provided between each single lens and the corresponding imaging region. 201 indicates a red wavelength band transmitting filter provided between the single lens 101 and the imaging region 901. 202 indicates a green wavelength band transmitting filter provided between the single lens 102 and the imaging region 902. 203 indicates a green wavelength band transmitting filter between the single lens 103 and the imaging region 903. 204 indicates a blue wavelength band transmitting filter provided between the single lens 104 and the imaging region 904. 205 indicates a light shielding plate that causes each imaging region to receive only light in one wavelength band and prevents the wavelength band light reflected from a color filter from being scattered into other color filters. 206 indicates a substrate including a computing apparatus, such as a digital signal processor (DSP) and the like, on which the imaging sensor 900 is provided. 207 indicates a housing for the imaging apparatus.

In FIG. 27, the substrate 206 and the imaging sensor 900 are shown as if they float in the air. Actually, they are supported by the three-dimensional drive means described in FIGS. 14 to 20. Relative positions of the four single lenses 101, 102, 103 and 104 and the imaging sensor 900 can be changed in directions perpendicular and/or parallel to the optical axes of the respective single lenses using the three-dimensional drive means.

In the imaging apparatus of Embodiment 3, four images captured by the four imaging regions 901, 902, 903 and 904 are combined to obtain a color image. Parallax detection, parallax correction, and combination of parallax-corrected images can be achieved using the method shown in FIGS. 9 to 13. Also, focus control, operator jitters free, magnified picture (zoomed picture) imaging and the like can be achieved using the method shown in Embodiment 1. In this case, the imaging regions 901, 902, 903 and 904 serve as the imaging sensors 105, 106, 107 and 108 in Embodiment 1, respectively. The above-described image combination is performed by the substrate 206 including a computing apparatus, such as a DSP or the like.

By using and dividing a single imaging sensor into a plurality of imaging regions as in Embodiment 3, positioning of a plurality of imaging sensors is not required, resulting in easy assembly and low cost.

In Embodiment 3, a single imaging sensor is divided into four imaging regions. Alternatively, two imaging sensors can be used and each imaging sensor can be divided into two imaging regions, so that a total of four imaging regions can be used.

Embodiment 4

In Embodiments 1 to 3, a plurality of lens systems are used and each lens system corresponds only to a green, red or blue wavelength region. Therefore, a requirement with respect to chromatic aberration can be relaxed, so that the focal length of each lens system can be shortened. In Embodiment 2, by forming a diffraction grating on a lens surface to improve distortion of focal plane, the focal length can be shortened further.

Figure 28A:
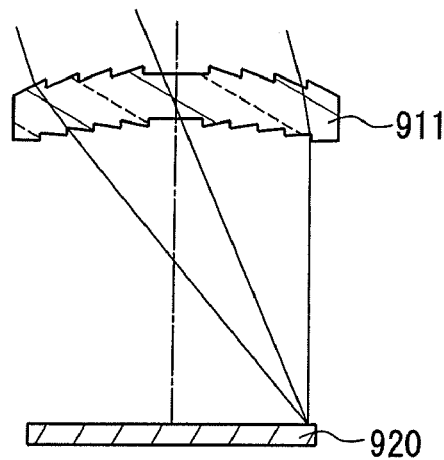
FIGS. 28A and 28B are diagrams showing relationships between the focal length of a lens system and an incident angle of light to an imaging sensor.
Figure 28B:
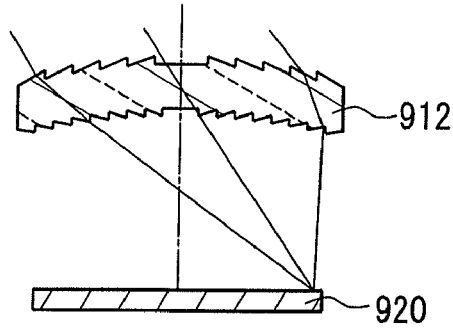

FIGS. 28A and 28B are diagrams showing relationships between the focal length of a lens system and an incident angle of light to an imaging sensor.

FIG. 28A shows a state in which a lens 911 having a relatively long focal length converges light onto a periphery of an imaging sensor 920. FIG. 28B shows a state in which a lens 912 having a relatively short focal length converges light onto a periphery of the imaging sensor 920. As can be seen from both the figures, the shorter the focal length of the lens, the larger the incident angle of light to the imaging sensor 920. Therefore, in order to produce a thin imaging apparatus, it is effective to modify the lens system to reduce the focal length thereof, and in addition, it is necessary to modify the imaging sensor so that it can receive light having a large incident angle.

Next, a structure of an imaging sensor that can receive light having a large incident angle will be described.

Figure 29:
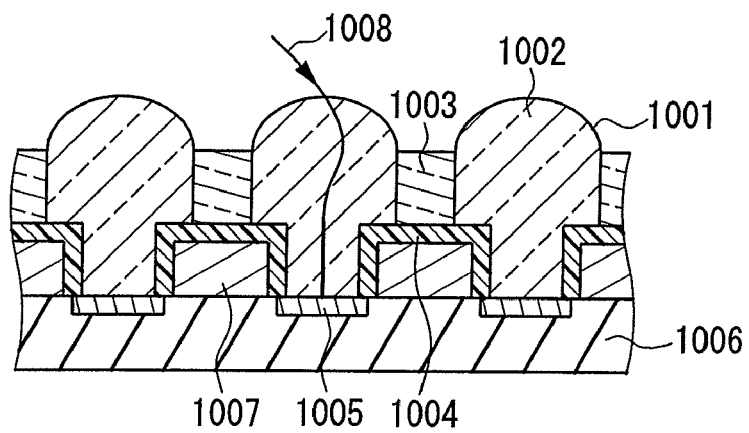
FIG. 29 is a cross-sectional view of an imaging sensor for use in an imaging apparatus according to Embodiment 4 of the present invention.

FIG. 29 is a cross-sectional view of an imaging sensor for use in an imaging apparatus according to Embodiment 4 of the present invention.

In FIG. 29, 1001 indicates a microlens, 1002 indicates an optical material having a high refractive index (hereinafter referred to as a "high-refractive index material"), 1003 indicates an optical material having a low refractive index (hereinafter referred to as a "low-refractive index material"), 1004 indicates a light shielding portion, 1005 indicates a light receiving portion, 1006 indicates a silicon substrate, and 1007 indicates a wiring portion. In one pixel, one microlens 1001, one high-refractive index material 1002 and one light receiving portion 1005 are provided. FIG. 29 shows a cross-section of each pixel. Light tends to be confined in a portion having a high refractive index. Light from a object, which is incident on the microlens 1001, transmits through the high-refractive index material 1002 to reach the light receiving portion 1005. In FIG. 29, the microlens 1001 is also formed of an optical material having the same high refractive index as that of the high-refractive index material 1002. As shown by an optical path 1008, the above-described well waveguide structure can guide light having a large incident angle to the light receiving portion 1005. In general, the high-refractive index material 1002 preferably has a refractive index of 1.8 or more, while the low-refractive index material 1003 preferably has a refractive index of 1.8 or less.

Figure 33:
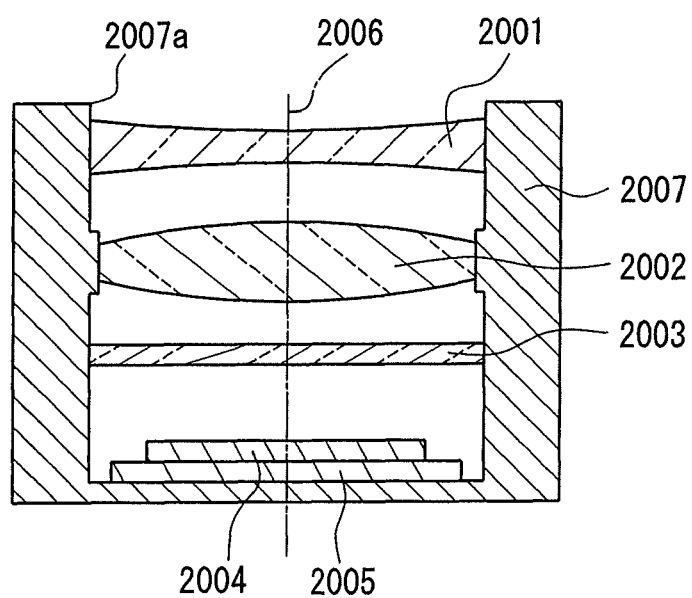
FIG. 33 is a cross-sectional view of a conventional imaging apparatus.

An imaging sensor having a well waveguide structure, such as that show in FIG. 29, is effective for not only an imaging apparatus having a plurality of lens systems and a plurality of imaging regions according to Embodiments 1 to 4, but also the conventional imaging apparatus of FIG. 33.

A production process for an imaging sensor having a well waveguide structure, such as that show in FIG. 29, will be described.

FIGS. 30A to 30L are cross-sectional views showing a production process for the imaging sensor of Embodiment 4 of the present invention. In FIGS. 30A to 30L, the same components as those of FIG. 29 are indicated with the same reference numerals and will not be explained.

Figure 30A:
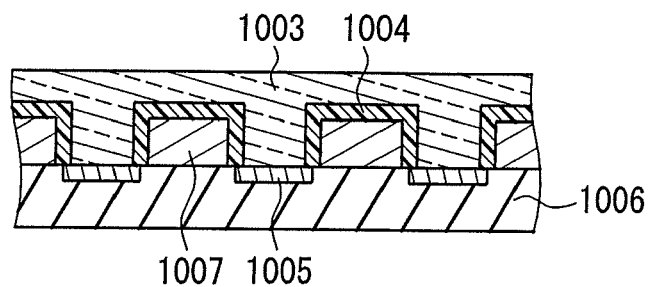
FIGS. 30A to 30L are cross-sectional views showing a production process for the imaging sensor of Embodiment 4 of the present invention.

As shown in FIG. 30A, firstly, as in a process for a general imaging sensor, the light receiving portion 1005, the wiring portion 1007 and the light shielding portion 1004 are formed on the silicon substrate 1006, and on the resultant structure, a layer of the low-refractive index material 1003 (first layer) is formed. As the low-refractive index material 1003, for example, silicon oxide having a refractive index of about 1.5 can be used.

Figure 30B:
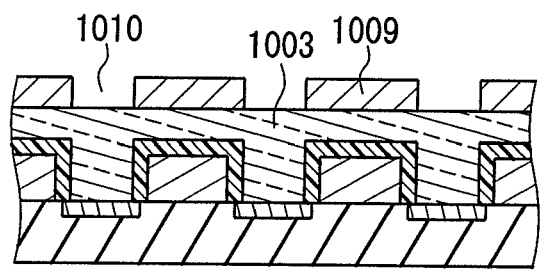

Next, as shown in FIG. 30B, an etching pattern 1009 is formed on the low-refractive index material 1003 using nickel or the like. The etching pattern 1009 covers a top surface of the low-refractive index material 1003, except for a circular or quadrangular opening 1010. The opening 1010 is formed at a position corresponding to the light receiving portion 1005.

Figure 30C:
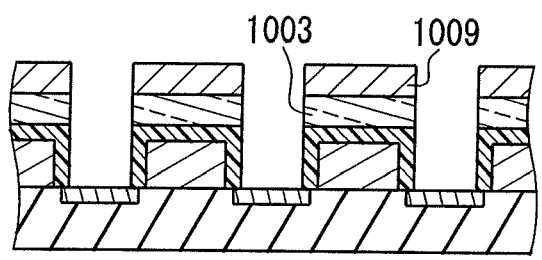

Next, as shown in FIG. 30C, the low-refractive index material 1003 is removed by etching until reaching the light receiving portion 1005 in the opening 1010, leaving the etching pattern 1009.

Figure 30D:
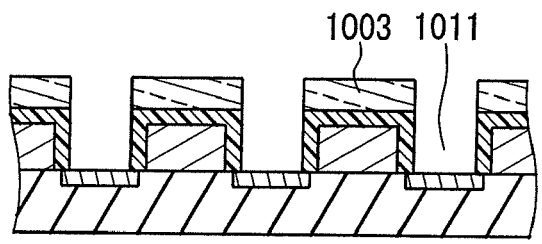

Next, as shown in FIG. 30D, the remaining etching pattern 1009 is removed to form a circular or quadrangular first hole 1011.

Figure 30E:
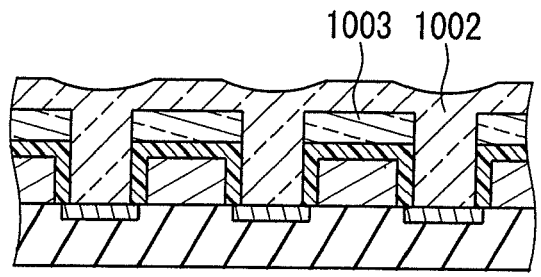

Next, as shown in FIG. 30E, a high-refractive index material 1002 is filled in the first hole 1011. As the high-refractive index material, for example, silicon nitride having a refractive index of about 2.0 can be used. As the filling process, for example, a CVD method can be used.

Figure 30F:
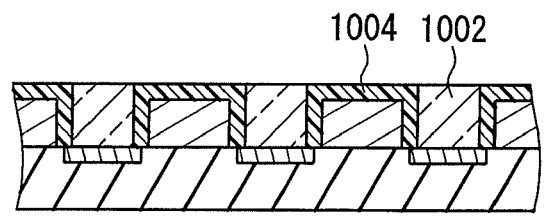

Next, as shown in FIG. 30F, a top surface of the resultant structure is flattened. As the flattening process, for example, etching or polishing can be used.

Figure 30G:
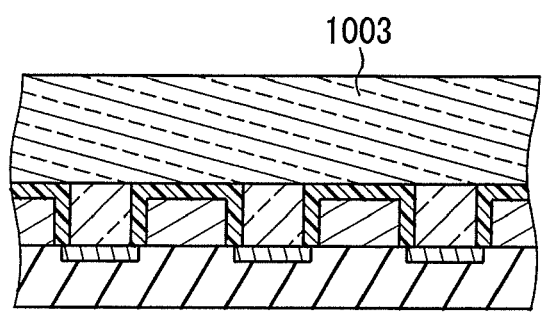

Next, as shown in FIG. 30G, a layer of the low-refractive index material 1003 (second layer) is formed on a surface of the resultant structure.

Figure 30H:
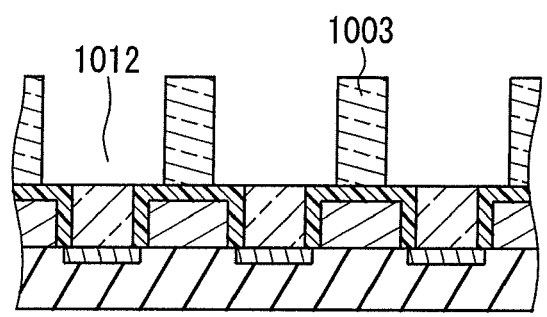

Next, an etching pattern is formed as in FIG. 30B to form a second hole 1012 in the low-refractive index material 1003 as in FIG. 30C. As in FIG. 30D, the etching pattern is removed to form a circular or quadrangular second hole 1012 in the low-refractive index material 1003 as shown in FIG. 30H. The second hole 1012 is formed at a position corresponding to the light receiving portion 1005 as with the first hole 1011, and has an opening having a diameter larger than that of the first hole 1011.

Figure 30I:
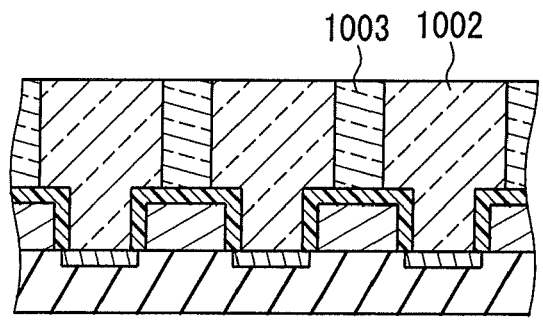

Next, as shown in FIG. 30I, the high-refractive index material 1002 is filled in the second hole 1012 as in FIG. 30E, and a top surface of the resultant structure is flattened as in FIG. 30F.

Figure 30J:
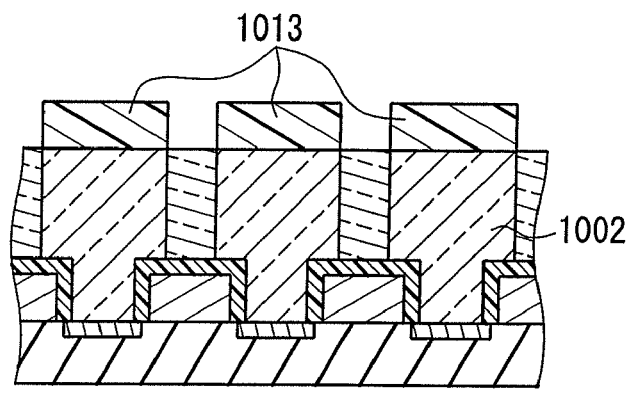

Next, as shown in FIG. 30J, a photoresist layer 1013 is formed on the high-refractive index material 1002.

Figure 30K:
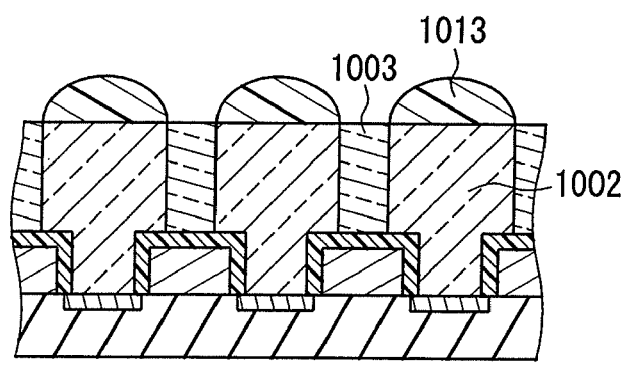

Next, as shown in FIG. 30K, the photoresist layer 1013 is baked with high temperature to round a top surface thereof.

Figure 30L:
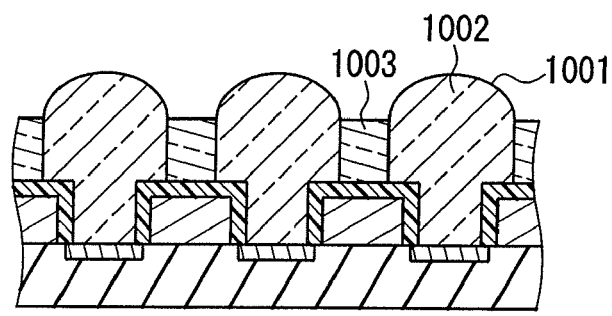

Next, as shown in FIG. 30L, the photoresist layer 1013, the high-refractive index material 1002 and the low-refractive index material 1003 are etched simultaneously from the top. The etching rates of these materials are appropriately selected to form a microlens 1001 made of the high-refractive index material 1002.

Thus, the imaging sensor having the structure of FIG. 29 can be produced.

When the high-refractive index material 1002 is filled in a hole formed in the low-refractive index material 1003 to form a well waveguide structure, such as that shown in FIG. 29, it is difficult to fill the high-refractive index material 1002 in the hole without hollow space if the aspect ratio (hole depth/hole diameter) of the hole is large. According to the above-described method of this embodiment, the high-refractive index material 1002 is filled in two steps as shown in FIGS. 30E and 30I. Therefore, the aspect ratio of a hole to be filled in one step can be made small and the high-refractive index material 1002 can be filled sufficiently throughout the hole.

When the high-refractive index material 1002 is filled in two steps, the diameter of a hole to be filled in each step, i.e., the diameters of the first hole 1011 and the second hole 1012 in the above-described embodiments, can be made different from each other. Therefore, as in the above-described embodiment, the diameter of the second hole 1012 farther from the light receiving portion 1005 can be larger than that of the first hole 1011 closer thereto. With this structure, an area where external light is incident can be larger than a light receiving area of the light receiving portion 1005. Therefore, light obliquely incident to the microlens 1001 can be guided efficiently to the light receiving portion 1005 as shown in the optical path 1008 of FIG. 29 while being confined within the high-refractive index material 1002.

Embodiment 5

As an example of a portable equipment comprising the imaging apparatus of the present invention, a mobile phone will be described.

Figure 31A:
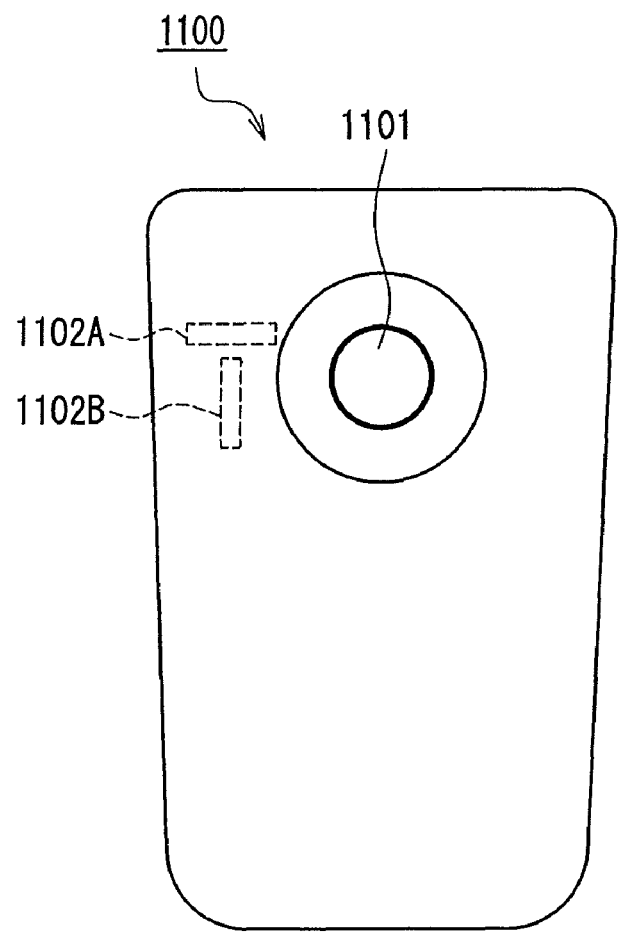
FIG. 31A is a front view of an embodiment of a mobile phone comprising the imaging apparatus of the present invention.
Figure 31B:
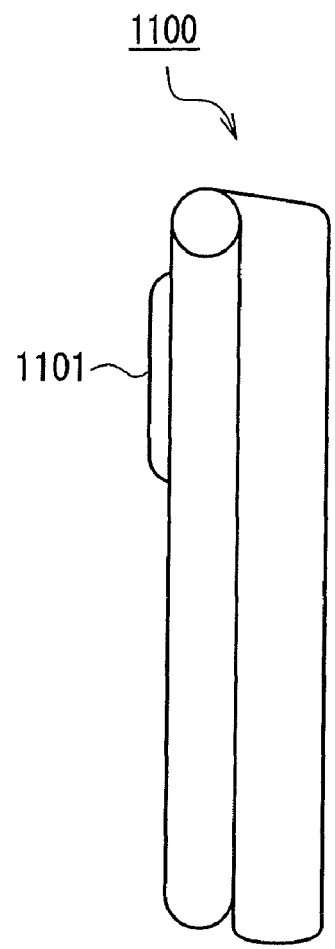
FIG. 31B is a side view thereof.

FIG. 31A is a front view of an embodiment of a mobile phone comprising the imaging apparatus of the present invention. FIG. 31B is a side view thereof.

In FIGS. 31A and 31B, 1100 indicates the mobile phone and 1101 indicates an imaging apparatus that is shown in any of Embodiments 1 to 4 of the present invention. Since the imaging apparatuses of Embodiments 1 to 4 of the present invention are thin, the mobile phone 1100 comprising the imaging apparatus can also be thin. In addition, the imaging apparatus of the present invention has a focus control function that permits it to take from a distant picture to a close-up picture and can perform operator jitters free electronically without changing the lens system, and further can take a magnified picture electronically without a degradation in resolution. Therefore, it is possible to provide the thin mobile phone 1100 having a multifunctional imaging apparatus 1101.

In the operator jitters free, as described in FIG. 21, an image is captured a plurality of times, and a plurality of resultant images are combined in a manner such that matching portions between each image overlap each other, resulting in a sharp object image. In order to achieve the electronic jitters free function, it is necessary to perform image processing, such as recognition of matching portions among a plurality of images or the like, with a high rate.

In FIG. 31A, 1102A and 1102B are angular velocity sensors, which are provided close to the imaging apparatus 1101. The angular velocity sensors are the same as those that are used in an optical system having a general jitters free function that is performed by mechanically moving a portion of a lens system. The angular velocity sensors are used to detect a minute movement of the imaging apparatus due to operator jitters. A movement amount of a object among captured images is calculated, and based on a result of the calculation, movement amounts of the images that are used for combination of the images are determined. Alternatively, the calculation result is used to assist the movement amounts of the images for combination of the images. As a result, a quicker jitters free function can be achieved, compared to when only captured images are used for jitters free.

Embodiment 6

The three-dimensional drive means described with reference to FIGS. 14 to 20 can be applied to not only an imaging apparatus having a plurality of lens systems and a plurality of imaging regions, such as those of Embodiments 1 to 3, but also an imaging apparatus having a composite lens system assembled on a signal optical axis.

Figure 32:
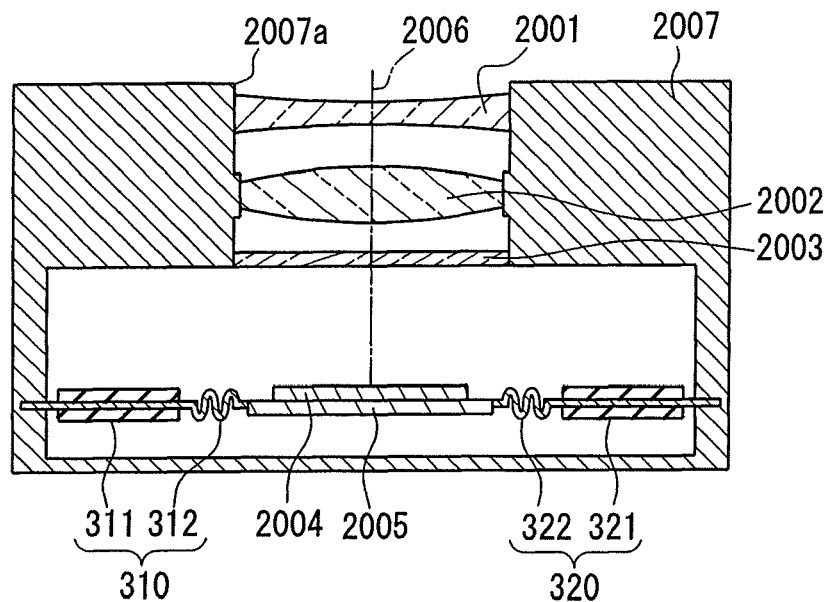
FIG. 32 is a cross-sectional view of an imaging apparatus according to Embodiment 6 of the present invention.

FIG. 32 is a cross-sectional view of an imaging apparatus according to Embodiment 6 of the present invention. In FIG. 32, the same components as those of FIGS. 1 to 31 and 33 are indicated with the same reference numerals and will not be explained.

In FIG. 32, 2001 and 2002 each indicates a single lens, 2003 indicates a filter, 2004 indicates an imaging sensor, and 2005 indicates a substrate including a computing apparatus, such as a digital signal processor (DSP) or the like. The single lenses 2001 and 2002, the filter 2003, the imaging sensor 2004 and the substrate 2005 are disposed in a housing 2007 in a manner such that an optical axis 2006 of the lens system passes through substantially a center of the imaging sensor 2004. Light from a object that passes through an opening 2007a of the housing 2007 and enters the housing 2007 is converged onto the imaging sensor 2004 by the lenses 2001 and 2002. In this case, the single lenses 2001 and 2002 are appropriately combined in a manner such that light in a red wavelength band, light a blue wavelength band and light in a green wavelength band that are contained in the light from the object are converged to the same imaging position with the same image magnification factor, thereby preventing deterioration of the captured image due to chromatic aberration. The light converged on the imaging sensor 2004 is converted to an electrical signal by the imaging sensor 2004, and the electrical signal is processed by the computing apparatus included in the substrate 2005.

In order to take a distant picture and a close-up picture, a focus control to move relative positions of the lens system and the imaging sensor in a direction parallel to the optical axis 2006 of the lens system is required. Also in a conventional imaging apparatus, such as that of FIG. 33, if the relative positions of the lens system and the imaging sensor can be moved in a direction parallel to the optical axis 2006 of the lens system as shown in FIGS. 22A and 22B, a magnified picture (zoomed picture) can be electronically taken without a degradation in resolution. In FIG. 32, the relative positions of the lens system and the imaging sensor are changed using the drive means described in Embodiment 1 (see FIGS. 14 to 20) that moves the imaging sensor in directions parallel and perpendicular to the optical axis 2006. Two actuators each comprising an oscillator and an elastic spring portion are disposed, facing each other across the imaging sensor 2004, or alternatively, four actuators are disposed at intervals of 90 degrees around the imaging sensor 2004 as a center. The actuators are operated as shown in FIGS. 18 and 19. By using the drive means, the focus control function and the electronic magnified picture function can be conferred to an imaging apparatus having a conventional composite lens.

Rather than the imaging sensor 2004, all or a portion of the single lenses 2001 and 2002 constituting the lens system may be moved in directions parallel to and perpendicular to the optical axis 2006 using the drive means described in Embodiment 1 (see FIGS. 14 to 20).

Embodiments 1 to 6 are considered in all respects as illustrative and not restrictive. The scope of the invention is indicated by the appended claims rather than by the foregoing description. All changes that come within the meaning and range of equivalency of the appended claims are intended to be embraced therein.

The applicable field of the imaging apparatus of the present invention is not particularly limited. Specifically, the present invention is useful for an imaging apparatus comprising a portable equipment, such as a mobile phone or the like, since the imaging apparatus can have a focus control function, an operator jitters free function, and a magnified picture function. Further, the present invention can be applied to applications, such as a surveillance camera, an in-car camera, or the like.

What is claimed is:

1. A method for producing an imaging apparatus, comprising:
    disposing a plurality of imaging regions in one-to-one correspondence with a plurality of optical systems, each of the imaging regions including a plurality of pixels arranged in a two-dimensional matrix,
        the plurality of imaging regions being disposed in a matrix along a direction substantially parallel to an array direction of the plurality of pixels included in the imaging regions, and
        each of the imaging regions being disposed on an optical axis of the respective optical systems on a one-to-one basis;
    assigning respective origins of the respective imaging regions based on respective intersections of the respective optical axes of the respective optical systems and the respective imaging regions corresponding thereto without a movement of the origins and the imaging regions depending on a distance of a subject,
        adjacent ones of the imaging regions being disposed such that a line connecting two of the assigned respective intersections of adjacent imaging regions disposed in the matrix is not parallel to the array direction of the plurality of pixels of at least one of the adjacent imaging regions; and
    specifying positions of the plurality of pixels of the respective imaging regions using the respective origins as references.

2. The method according to claim 1, wherein a plurality of images of an object captured by using the plurality of optical systems and the plurality of imaging regions are used to assign the respective origins of the respective imaging regions, and the object is a substantially point light source provided at a substantially infinite distance.

3. The method according claim 1, wherein a position of a pixel having a largest light intensity of received light among the plurality of pixels included in the imaging regions is assigned as the origin.

4. The method according claim 1, wherein a light intensity is interpolated between adjacent pixels based on light intensities of light received by the plurality of pixels included in the imaging region to assign a position of a pixel having a largest light intensity as the origin.

* * * * *